(12) United States Patent
Nishida et al.

(10) Patent No.: US 11,233,199 B2
(45) Date of Patent: Jan. 25, 2022

(54) VAPOR DEPOSITION MASK MANUFACTURING METHOD, VAPOR DEPOSITION MASK, AND ORGANIC SEMICONDUCTOR ELEMENT MANUFACTURING METHOD

(71) Applicant: HON HAI PRECISION INDUSTRY CO., LTD., New Taipei (TW)

(72) Inventors: Koshi Nishida, Osaka (JP); Kozo Yano, Osaka (JP); Katsuhiko Kishimoto, Osaka (JP); Susumu Sakio, Osaka (JP); Hideo Takei, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 480 days.

(21) Appl. No.: 16/077,045

(22) PCT Filed: Jul. 25, 2016

(86) PCT No.: PCT/JP2016/071759
§ 371 (c)(1),
(2) Date: Aug. 10, 2018

(87) PCT Pub. No.: WO2017/138166
PCT Pub. Date: Aug. 17, 2017

(65) Prior Publication Data
US 2019/0044070 A1 Feb. 7, 2019

(30) Foreign Application Priority Data
Feb. 10, 2016 (JP) .............................. JP2016-024011

(51) Int. Cl.
*H01L 51/00* (2006.01)
*C23C 14/24* (2006.01)
(Continued)

(52) U.S. Cl.
CPC ............ *H01L 51/0011* (2013.01); *B32B 3/14* (2013.01); *B32B 7/025* (2019.01); *C23C 14/042* (2013.01);
(Continued)

(58) Field of Classification Search
None
See application file for complete search history.

(56) References Cited

U.S. PATENT DOCUMENTS 9,334,556 B2* 5/2016 Sugimoto ............ B23K 26/342
10,557,191 B2* 2/2020 Nishida ............... H01L 51/0011
(Continued)

FOREIGN PATENT DOCUMENTS

JP 2009-167471 A 7/2009
JP 2013-142195 A 7/2013
(Continued)

OTHER PUBLICATIONS

JPO Abstract of JP 2014-205870 A (Year: 2014).*
Machine Translation of JP 2013-082687 (corresponding to published JP 2014-205870 A) (Year: 2014).*

*Primary Examiner* — Kevin M Bernatz
(74) *Attorney, Agent, or Firm* — ScienBiziP, P.C.

(57) ABSTRACT

A method for manufacturing a vapor deposition mask including a resin layer, and a magnetic metal layer formed on the resin layer, the method including the steps of: providing a substrate; forming a resin layer by applying a solution including a resin material or a precursor solution of a resin material on a surface of the substrate, and then performing a heat treatment thereon; forming a magnetic metal layer on the resin layer, mask portion including a solid portion where a metal film is present and a hollow portion where the metal film is absent; forming a plurality of openings in a region of the resin layer that is located in the (Continued)

hollow portion of the mask portion; and removing the resin layer from the substrate after forming a plurality of openings in a region of the resin layer.

16 Claims, 23 Drawing Sheets

(51) Int. Cl.
    *C23C 14/04*     (2006.01)
    *B32B 3/14*     (2006.01)
    *B32B 7/025*     (2019.01)
    *H01L 27/32*     (2006.01)
    *H01L 51/50*     (2006.01)
    *H01L 51/52*     (2006.01)
    *H01L 51/56*     (2006.01)

(52) U.S. Cl.
    CPC .......... *C23C 14/24* (2013.01); *H01L 27/3211* (2013.01); *H01L 27/3246* (2013.01); *B32B 2307/208* (2013.01); *H01L 51/001* (2013.01); *H01L 51/5056* (2013.01); *H01L 51/5072* (2013.01); *H01L 51/5092* (2013.01); *H01L 51/5203* (2013.01); *H01L 51/56* (2013.01); *Y10T 428/32* (2015.01)

(56) References Cited

U.S. PATENT DOCUMENTS

| | | | |
|---|---|---|---|
| 10,934,614 B2 * | 3/2021 | Sakio | .................. C23C 14/12 |
| 2011/0048323 A1 | 3/2011 | Kondo et al. | |
| 2014/0199808 A1 * | 7/2014 | Sugimoto | ............. C23C 14/042 |
| | | | 438/99 |
| 2015/0017759 A1 * | 1/2015 | Hirobe | ................ H01L 51/0011 |
| | | | 438/99 |
| 2015/0284839 A1 | 10/2015 | Sugimoto et al. | |
| 2016/0115580 A1 * | 4/2016 | Mizumura | ................ C23F 1/02 |
| | | | 118/720 |
| 2016/0193623 A1 | 7/2016 | Sugimoto et al. | |
| 2016/0194745 A1 | 7/2016 | Sugimoto et al. | |
| 2017/0275749 A1 * | 9/2017 | Sato | ..................... H01L 51/0011 |
| 2018/0148822 A1 * | 5/2018 | Takeda | ..................... C23C 14/24 |
| 2019/0067578 A1 * | 2/2019 | Kishimoto | .......... H01L 51/0011 |
| 2019/0100834 A1 * | 4/2019 | Sakio | ..................... C23C 14/24 |
| 2019/0203338 A1 * | 7/2019 | Kawasaki | ............. C23C 14/042 |
| 2019/0211436 A1 * | 7/2019 | Nishida | ................. C23C 14/042 |
| 2020/0299821 A1 * | 9/2020 | Nishida | ................ B41M 7/0072 |

FOREIGN PATENT DOCUMENTS

| | | | | |
|---|---|---|---|---|
| JP | 2013-173968 A | | 9/2013 | |
| JP | 2013173968 A | * | 9/2013 | |
| JP | 2013-209710 A | | 10/2013 | |
| JP | 2013209710 A | * | 10/2013 | |
| JP | 2014-065928 A | | 4/2014 | |
| JP | 2014065928 A | * | 4/2014 | |
| JP | 2014-133938 A | | 7/2014 | |
| JP | 2014-205870 A | | 10/2014 | |
| JP | 2014205870 A | * | 10/2014 | ........... C23C 14/042 |
| WO | 2015/053250 A1 | | 4/2015 | |
| WO | WO-2015053250 A1 | * | 4/2015 | ............. H05B 33/10 |
| WO | 2015/115136 A1 | | 8/2015 | |
| WO | WO-2015115136 A1 | * | 8/2015 | ........... B23K 26/382 |

* cited by examiner (a)

(b)

(c)

(d)

(e)

(a)

(b)

(c)

VAPOR DEPOSITION MASK MANUFACTURING METHOD, VAPOR DEPOSITION MASK, AND ORGANIC SEMICONDUCTOR ELEMENT MANUFACTURING METHOD

TECHNICAL FIELD

The present invention relates to a method for manufacturing a vapor deposition mask, and particularly to a method for manufacturing a vapor deposition mask having a structure in which a resin layer and a metal layer are layered together. The present invention also relates to a vapor deposition mask, and a method for manufacturing an organic semiconductor device using a vapor deposition mask.

BACKGROUND ART

In recent years, organic EL (Electro Luminescence) display devices have been drawing public attention as a display of the next generation. With organic EL display devices that are currently mass-produced, the formation of an organic EL layer is primarily done by using a vacuum vapor deposition method.

Typically, a mask made of a metal (a metal mask) is used as the vapor deposition mask. However, with the increasing definition of organic EL display devices, it is becoming difficult to precisely form a vapor deposition pattern using a metal mask. This is because it is difficult with current metal processing techniques to precisely form small openings corresponding to a short pixel pitch (e.g., about 10 to 20 µm) in a metal plate (e.g., a thickness of about 100 µm) to be the metal mask.

In view of this, a vapor deposition mask (hereinafter referred to also as a "layered mask") having a structure in which a resin layer and a metal layer are layered together has been proposed in the art as a vapor deposition mask for forming a vapor deposition pattern with a high definition.

For example, Patent Document No. 1 discloses a layered mask including a resin film layered with a hold member, which is a metal magnetic member. A plurality of openings corresponding to an intended vapor deposition pattern are formed in the resin film. Slits whose size is larger than the openings of the resin film are formed in the hold member. The openings of the resin film are arranged in the slits. Therefore, when the layered mask of Patent Document No. 1 is used, the vapor deposition pattern is formed corresponding to the plurality of openings of the resin film. Even small openings can be formed with a high precision in a resin film that is thinner than an ordinary metal plate used for a metal mask.

When forming small openings as described above in the resin film, a laser ablation method is suitably used. Patent Document No. 1 describes a method in which a resin film placed on a support member (e.g., a glass substrate) is irradiated with a laser so as to form openings of an intended size.

FIGS. 26(a) to 26(d) are schematic cross-sectional views each illustrating a step of a conventional method for manufacturing a vapor deposition mask disclosed in Patent Document No. 1.

According to Patent Document No. 1, first, as shown in FIG. 26(a), a metal layer 82 having openings (slits) 85 therein is formed on a resin film 81, thereby obtaining a layered film 80. Then, as shown in FIG. 26(b), the layered film 80 is attached to a frame 87 with tension in a predetermined in-plane direction(s) applied on the layered film 80. Then, the layered film 80 is placed on a glass substrate 90 as shown in FIG. 26(c). In this process, a surface of the resin film 81 that is opposite from the metal layer 82 is brought into close contact with the glass substrate 90 with a liquid 88 such as ethanol therebetween. Then, as shown in FIG. 26(d), portions of the resin film 81 that is exposed through the slits 85 of the metal layer 82 are irradiated with a laser beam L, thereby forming a plurality of openings 89 in the resin film 81. Thus, a layered vapor deposition mask 900 is manufactured.

CITATION LIST

Patent Literature

Japanese Laid-Open Patent Publication No. 2014-205870

SUMMARY OF INVENTION

Technical Problem

However, with the conventional manufacturing method shown in FIG. 26, it may be difficult to process the resin film with a high precision, and burrs may occur at the peripheral edge of the openings of the resin film.

When a resin film has burrs, it is difficult to bring a finished vapor deposition mask into close contact with a substrate to be the vapor deposition object (hereinafter referred to also as a "vapor deposition substrate"), and there may be a gap between the vapor deposition mask and the vapor deposition substrate. Thus, when a conventional vapor deposition mask is used, there is a possibility that a vapor deposition pattern having a high definition corresponding to the openings of the vapor deposition mask is not obtained. The details will be described later.

Note that although attempts have been made to remove burrs by wiping, or the like, after a resin film is processed, no method has been proposed in the art that is capable of suppressing the occurrence of burrs itself.

The present invention has been made in view of the above, and an object thereof is to provide a layered vapor deposition mask that can suitably be used for forming a vapor deposition pattern having a high definition, and a method for manufacturing the same. Another object of the present invention is to provide a method for manufacturing an organic semiconductor device using such a vapor deposition mask.

Solution to Problem

A method for manufacturing a vapor deposition mask according to an embodiment of the present invention is a method for manufacturing a vapor deposition mask including a resin layer, and a magnetic metal layer formed on the resin layer, the method including the steps of: (A) providing a substrate; (B) forming a resin layer by applying a solution including a resin material or a precursor solution of a resin material on a surface of the substrate, and then performing a heat treatment thereon; (C) forming a magnetic metal layer on the resin layer, wherein the magnetic metal layer includes a mask portion and a peripheral portion arranged so as to surround the mask portion, the mask portion including a solid portion where a metal film is present and a hollow portion where the metal film is absent; (D) forming a plurality of openings in a region of the resin layer that is located in the hollow portion of the mask portion; and (E) removing the resin layer from the substrate after the step (D).

In one embodiment, the method further includes a step (F), between the step (C) and the step (E), of securing a frame on the peripheral portion of the magnetic metal layer.

In one embodiment, the step (F) is performed after the step (D).

In one embodiment, in the step (F), the frame is secured on the magnetic metal layer with no external tension applied on the magnetic metal layer and the resin layer in any in-plane directions of the layers.

In one embodiment, the method further includes a step (F), after the step (E), of securing a frame on the peripheral portion of the magnetic metal layer.

In one embodiment, in the step (C), the solid portion of the mask portion includes a plurality of discretely-arranged island-like portions.

A vapor deposition mask according to an embodiment of the present invention is manufactured by any one of the methods set forth above.

A vapor deposition mask according to another embodiment of the present invention is a vapor deposition mask including a resin layer, and a magnetic metal layer formed on the resin layer, wherein: the magnetic metal layer includes a mask portion and a peripheral portion arranged so as to surround the mask portion, the mask portion including a solid portion where a metal film is present and a hollow portion where the metal film is absent; the vapor deposition mask further includes a frame secured on the peripheral portion of the magnetic metal layer; and the resin layer has a plurality of openings arranged in the hollow portion of the mask portion, and is not receiving tension in any in-plane directions of the resin layer from the frame.

In one embodiment, the solid portion of the magnetic metal layer includes a plurality of discretely-arranged island-like portions.

In one embodiment, the hollow portion of the magnetic metal layer includes a plurality of slits.

In one embodiment, the frame is formed from a metal or a plastic.

In one embodiment, the resin layer is a layer formed by performing a heat treatment on a solution including a resin material or a precursor solution of a resin material applied on a substrate surface.

In one embodiment, the magnetic metal layer is a plating layer or a metal foil.

A vapor deposition mask according to still another embodiment of the present invention is a vapor deposition mask including a resin layer, and a magnetic metal layer formed on the resin layer, wherein: the magnetic metal layer includes a mask portion and a peripheral portion arranged so as to surround the mask portion, the mask portion including a solid portion where a metal film is present and a hollow portion where the metal film is absent; and the resin layer is a layer formed by performing a heat treatment on a solution including a resin material applied on a substrate surface, and has a plurality of openings arranged in the hollow portion of the mask portion.

Still another vapor deposition mask of the present invention is a vapor deposition mask including a resin layer, and a magnetic metal layer formed on the resin layer, wherein: the magnetic metal layer includes a plurality of discretely-arranged island-like portions, and a peripheral portion arranged so as to surround the plurality of island-like portions; and the resin layer has a plurality of openings arranged between the plurality of island-like portions.

In one embodiment, $\alpha M$ is greater than $\alpha R$, and $\alpha M \cdot SM/\alpha R$ is 0.90 or more and 1.10 or less, where SM (%) denotes an area ratio of the plurality of island-like portions inside the peripheral portion as the magnetic metal layer is seen from a normal direction, $\alpha M$ (ppm/° C.) denotes a linear thermal expansion coefficient of a metal material forming the magnetic metal layer, and $\alpha R$ (ppm/° C.) denotes a linear thermal expansion coefficient of a resin film forming the resin layer.

In one embodiment, SM is 50% or less.

A method for manufacturing an organic semiconductor device according to an embodiment of the present invention includes the step of vapor-depositing an organic semiconductor material on a work by using any of the vapor deposition masks set forth above.

Advantageous Effects of Invention

An embodiment of the present invention provides a layered vapor deposition mask that can suitably be used for the formation of a vapor deposition pattern having a high definition, and a method for manufacturing the same.

DESCRIPTION OF EMBODIMENTS

Figure 1:
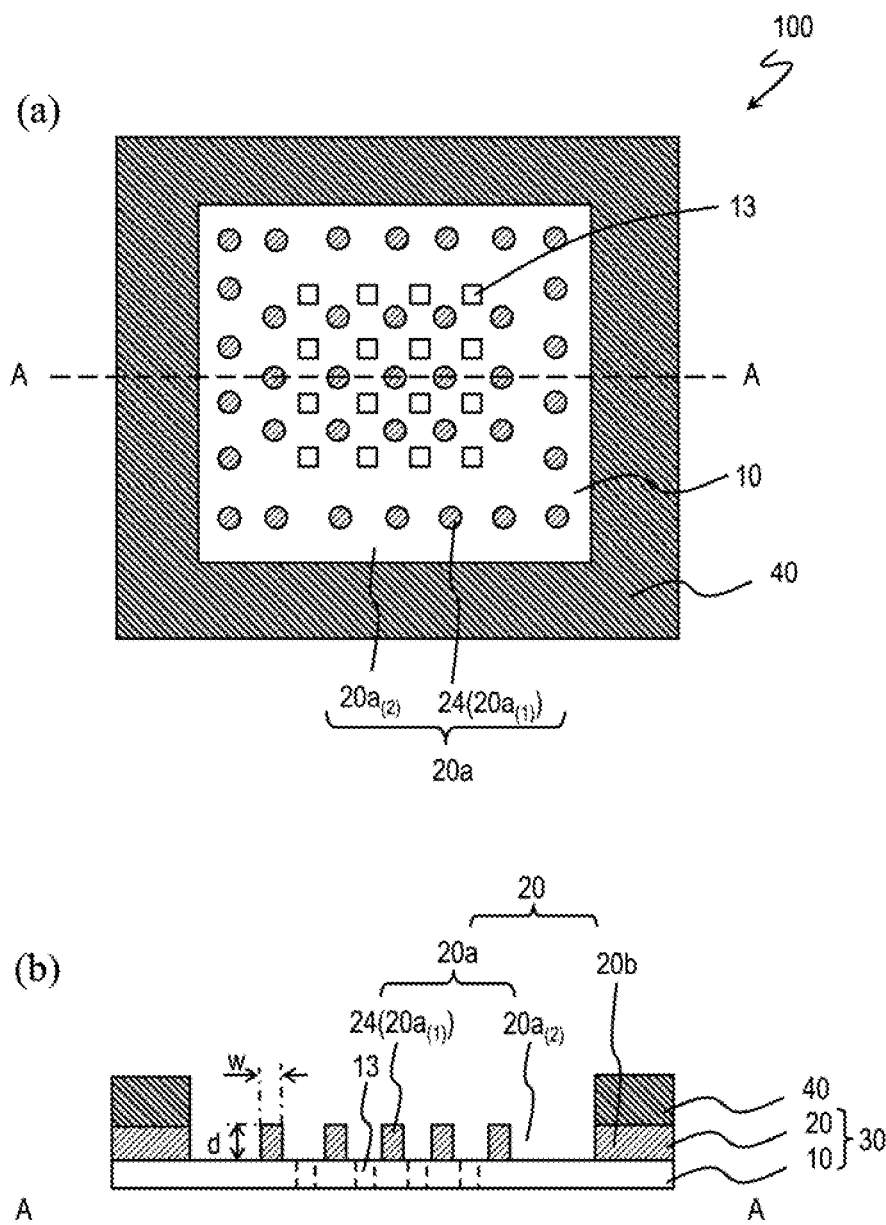
FIG. 1 (a) is a plan view schematically showing a vapor deposition mask 100 according to a first embodiment of the present invention, and (b) is a cross-sectional view taken along line A-A of FIG. 1(a).

With a conventional method for manufacturing a layered vapor deposition mask, burrs may be produced at the peripheral edge of the openings of the resin film, as described above. The present inventors conducted an in-depth study on how burrs are produced, arriving at the findings as follows.

With the conventional method, as described above with reference to FIGS. 26(c) and 26(d), the openings 89 are formed by irradiating predetermined regions (hereinafter referred to as "laser irradiation regions") of the resin film 81 with the laser beam L while the resin film 81 is kept in close contact with the glass substrate 90 because of the surface tension of the liquid 88 such as ethanol. Based on a study by the present inventors, it was found that with this method, bubbles are produced partially at the interface between the glass substrate 90 and the resin film 81 when bringing the resin film 81 into close contact with the glass substrate 90, thereby locally lowering the adhesion. Moreover, the present inventors found that when there is a bubble under a certain laser irradiation region of the resin film 81, it does not only make it difficult to form the openings 89 with a high precision but it also makes it likely that a burr is produced in that laser irradiation region. This will be described in detail with reference to FIG. 25.

FIGS. 25(a) to 25(d) are schematic cross-sectional views illustrating how a burr is produced because of a bubble between the glass substrate 90 and the resin film 81. FIG. 25 does not show the metal layer and the liquid.

As shown in FIG. 25(a), when the resin film 81 is brought into close contact on a support member such as the glass substrate 90 (e.g., with a liquid therebetween), a gap (bubble) 94 may be produced partially between the glass substrate 90 and the resin film 81. When a process on the resin film 81 using a laser ablation method (hereinafter referred to also simply as "laser process") is performed in this state, a laser irradiation region 92 for forming an opening may be placed in a portion of the resin film 81 that is located over the bubble 94, as shown in FIG. 25(b). The laser irradiation region 92 is irradiated in a plurality of shots while focusing on the surface of the resin film 81, for example.

Laser ablation refers to a phenomenon in which when the surface of a solid is irradiated with a laser beam, a constituent substance on the solid surface rapidly radiates because of the energy of the laser beam. Herein, the speed of radiation is referred to as the ablation speed. In a laser process, there may be an ablation speed distribution depending on the energy distribution across the laser irradiation region 92 so that a through hole is formed first only in a portion of the resin film 81. Then, as shown in FIG. 25(c), another portion 98 of the resin film 81 that has been thinned is folded back onto the reverse side of the resin film 81 (i.e., into the bubble 94 between the resin film 81 and the glass substrate 90), and the portion 98 is no longer irradiated with the laser beam L. As a result, the opening 89 is formed with the thinned portion 98 remaining unremoved. In the present specification, the portion 98 of the resin film 81 that is thinned and left remaining is referred to as a "burr".

With the burr 98 projecting on the reverse side of the resin film 81, when the vapor deposition mask is placed on a vapor deposition substrate, a portion of the vapor deposition mask may be lifted off the vapor deposition substrate. Then, there is a possibility that a vapor deposition pattern that is shaped corresponding to the openings 89 may not be obtained.

Note that a process of removing the burr 98 of the resin film 81 (a burr removing step) may be performed after the laser process. For example, attempts have been made to wipe the reverse surface of the resin film 81, for example. However, it is difficult, by a burr removing step, to entirely remove the burr 98 on the resin film 81. As shown in FIG. 25(d), wiping may possibly move back some burrs 98 so as to protrude into the opening 89, thereby causing shadowing during a vapor deposition step.

Based on the findings described above, the present inventors found a novel method with which it is possible to form, with a high precision, openings of an intended size in a resin layer supported on a support member while suppressing the occurrence of burrs, thus arriving at the present invention.

An embodiment of the present invention will now be described with reference to the drawings. Note that the present invention is not limited to the following embodiment.

First Embodiment

<Structure of Vapor Deposition Mask>

Referring to FIGS. 1(a) and 1(b), a vapor deposition mask 100 according to a first embodiment of the present invention will be described. FIGS. 1(a) and 1(b) are a plan view and a cross-sectional view, respectively, schematically showing the vapor deposition mask 100. FIG. 1(b) shows a cross section taken along line A-A of FIG. 1(a). Note that FIG. 1 schematically shows an example of the vapor deposition mask 100, and it is needless to say that the size, number, arrangement, length ratio, etc., of the various components are not limited to those shown in the figure. This similarly applies also to other figures to be referred to below.

As shown in FIGS. 1(a) and 1(b), the vapor deposition mask 100 includes a resin layer 10, and a magnetic metal layer (hereinafter referred to simply as "metal layer") 20 provided on the primary surface of the resin layer 10. That is, the vapor deposition mask 100 has a structure in which the resin layer 10 and the metal layer 20 are layered together.

The metal layer 20 includes a mask portion 20a, and a peripheral portion 20b arranged so as to surround the mask portion 20a. The mask portion 20a includes a solid portion $20a_{(1)}$ where a metal film is present, and a hollow portion $20a_{(2)}$ where the metal film is absent. The resin layer 10 includes a plurality of openings 13 arranged in the hollow portion $20a_{(2)}$ of the mask portion 20a. Hereinafter, a layered member 30 including the resin layer 10 and the metal layer 20 may be referred to as a "mask member". The frame 40 is provided along the peripheral edge of the mask member 30.

As will be described later, when performing a vapor deposition step using the vapor deposition mask 100, the vapor deposition mask 100 is arranged so that the metal layer 20 is located on the vapor deposition source side and the resin layer 10 is on the work (vapor deposition object) side. Since the metal layer 20 is a magnetic member, the vapor deposition mask 100 can be easily held and secured on the work in the vapor deposition step by using a magnetic chuck.

The resin layer 10, the metal layer 20 and the frame 40 will now be described in greater detail.

A plurality of openings 13 are formed in the resin layer 10. The size, shape and position of the plurality of openings 13 correspond to the vapor deposition pattern to be formed on the work. In the example shown in FIG. 1, the plurality of openings 13 are arranged in a matrix pattern in a region of the resin layer 10 that does not overlap the frame 40.

As will be described later, the resin layer 10 is a layer that is formed by applying a solution including a resin material (e.g., a soluble-type polyimide solution) or a solution including a precursor of a resin material (e.g., a polyimide precursor solution) on a support substrate such as a glass substrate, and performing a heat treatment thereon. The heat treatment, as used herein, includes a heat treatment for performing a baking step (e.g., 100° C. or more) when a soluble-type polyimide solution is used, and a heat treatment for performing a baking and curing step (e.g., 300° C. or more) when a polyimide precursor solution is used.

In the present embodiment, the plurality of openings 13 are formed by performing a laser process on the resin layer 10 on the support substrate. The support substrate and the resin layer 10 are in close contact with each other with no (or little) bubble therebetween, thereby suppressing the occurrence of burrs in the laser process step on the resin layer 10. Thus, the resin layer 10 of the present embodiment substantially has no burrs. Even when the resin layer 10 has burrs, the number of burrs (per unit area) is substantially lower as compared with conventional methods.

Moreover, in the present embodiment, the resin layer 10 does not receive tension in a layer plane direction(s) from the frame 40. With conventional manufacturing methods, a resin film (or a layered film of a resin film and a metal film) is secured on a frame while being stretched in a particular layer plane direction(s) by means of a stretcher, or the like (hereinafter referred to as a "stretching step"). In this case, at room temperature, the resin film secured on the frame receives tension from the frame that was given in the stretching step. In contrast, according to the present embodiment, the step of attaching the frame 40 is performed with no tension in the layer plane direction(s) being applied to the resin layer 10 from outside, as will be described later. Therefore, the resin layer 10 does not receive tension in the layer plane direction(s) from the frame 40. Note that "to receive tension in the layer plane direction(s) from the frame 40", as used herein, refers to receiving tension that was given in the stretching step (e.g., 10 N or more and 200 N or less, tension per unit cross-sectional area: 0.1 N/mm² or more and 30 N/mm² or less). That is, it does not include cases of vapor deposition masks manufactured with no stretching step, wherein tension (caused by a thermal stress) acts on a resin layer due to a difference in linear thermal expansion coefficient between the frame and the resin layer.

For example, polyimide can suitably be used as the material of the resin layer 10. Polyimide is desirable in terms of strength, chemical resistance and heat resistance. Other resin materials such as polyparaxylene, bismaleimide and silica hybrid polyimide may be used as the material of the resin layer 10. The linear thermal expansion coefficient αR (ppm/° C.) of the resin film of the resin layer 10 is preferably generally equal to the linear thermal expansion coefficient of the substrate, which is the vapor deposition object. Such a resin layer 10 can be formed based on the formation conditions, etc., such as the resin material and the curing conditions. The method for forming the resin layer 10 will be described later.

There is no particular limitation on the thickness of the resin layer 10. Note however that if the resin layer 10 is too thick, portions of the vapor deposition film may be thinner than an intended thickness (this is called "shadowing"). In order to suppress the occurrence of shadowing, the thickness of the resin layer 10 is preferably 25 μm or less. When it is 3 μm or more, it is possible to form a resin layer 10 having a more uniform thickness by performing a heat treatment on a solution including a resin material (or a precursor thereof) applied on the support substrate. Also in view of the strength and the cleaning tolerance of the resin layer 10 itself, it is preferred that the thickness of the resin layer 10 is 3 μm or more.

As described above, the metal layer 20 includes the mask portion 20a, and the peripheral portion 20b arranged so as to surround the mask portion 20a. In the present embodiment, the peripheral portion 20b is a portion that overlaps the frame 40, and the mask portion 20a is a portion that does not overlap the frame 40 (located inside the frame 40). The frame 40 is secured on the peripheral portion 20b by spot welding, or the like, for example.

In the example shown in FIG. 1, the solid portion (where the metal film is present) $20a_{(1)}$ of the mask portion 20a includes a plurality of discretely-arranged island-like portions 24. The metal film is absent in areas between the plurality of island-like portions 24 and between the island-like portions 24 and the peripheral portion 20b, thereby forming the hollow portion $20a_{(2)}$. The resin layer 10 is exposed through the hollow portion $20a_{(2)}$ of the metal layer 20. The plurality of openings 13 are arranged in the exposed portions of the resin layer 10.

In this example, the openings 13 are arranged between the plurality of island-like portions 24 as seen from the direction normal to the vapor deposition mask 100. That is, the island-like portions 24 and the openings 13 do not overlap each other. Although there is no particular limitation on the number of island-like portions 24 and the method of arrangement thereof, the island-like portions 24 may be arranged with a predetermined pitch so as to surround one or more openings 13, for example. The arrangement pitch of the openings 13 and the arrangement pitch of the island-like portions 24 may be similar to each other.

Various magnetic metal materials can be used as the material of the metal layer 20. Materials having a relatively large linear thermal expansion coefficient αM such as Ni, Cr, ferritic stainless steel and martensitic stainless steel, for example, may be used, or materials having a relatively small linear thermal expansion coefficient αM such as an Fe—Ni-based alloy (invar) or an Fe—Ni—Co-based alloy, for example, may be used.

Note that conventional vapor deposition masks such as that disclosed in Patent Document No. 1 are designed so that the size of slits of the metal layer is as small as possible, and the area ratio of the solid portion with respect to the mask portion is relatively high (over 70% in FIG. 1 of Patent Document No. 1). Therefore, a material having a small linear thermal expansion coefficient αM (e.g., αM: less than 6 ppm/° C.) was used as the material of the metal layer. This is to ensure the shape stability of the vapor deposition mask in the vapor deposition step. In contrast, with the present embodiment, it is possible to use a metal having a high linear thermal expansion coefficient αM that cannot be used with conventional methods. Since the metal layer 20 shown in FIG. 1 has an island-like structure including the discretely-arranged island-like portions 24, it is possible to reduce the thermal stress occurring between the resin layer 10 and the metal layer 20 even when using a metal material having a high linear thermal expansion coefficient αM. It is possible to further reduce the thermal stress by suppressing the area ratio of the island-like portions 24. Therefore, various metal materials can be used, irrespective of their linear thermal expansion coefficient, thus increasing the degree of freedom in selecting a metal material.

When the linear thermal expansion coefficient αM of the metal material is greater than the linear thermal expansion coefficient αW of the substrate to be the vapor deposition object and the linear thermal expansion coefficient αR of the resin film of the resin layer 10 (αR and αW are set to be generally equal to each other), the thermal stress caused by the difference between the thermal expansion coefficients may deform the resin layer 10, resulting in positional misalignment, depending on the vapor deposition temperature. Note that the "positional misalignment", as used herein, refers to the shape of the openings 13 deforming and the positions of the openings 13 shifting from the positions of the vapor deposition pattern to be formed, because of the deformation of the resin layer 10 due to the thermal stress. Therefore, in order to prevent the positional misalignment due to the deformation of the resin layer 10, it is preferred to adjust the area ratio SM of the solid portion (herein, the island-like portions 24) $20a_{(1)}$ with respect to the mask portion 20a. That is, where the area ratio of the island-like portions 24 in the mask portion 20a is SM (%), as the metal layer 20 is seen from the normal direction, it is preferred to adjust SM so that the value αM×SM is generally equal to αR. Specifically, the adjustment is made so that αM·SM/αR is 0.90 or more and 1.10 or less, for example. For example, SM can be set to be about 30% when the linear thermal expansion coefficient αR of the substrate to be the vapor deposition object and the resin layer 10 is 4 ppm/° C. and Ni whose linear thermal expansion coefficient αM is 14 ppm/° C. is used as the metal material.

The area ratio SM of the solid portion $20a_{(1)}$ may be 50% or less. Thus, it is possible to more effectively suppress the positional misalignment of the openings 13 because it is possible to reduce the thermal stress that acts on the resin layer 10 because of the difference in thermal expansion between the metal layer 20 and the resin layer 10 in the vapor deposition step. Note that even if SM is 50% or less, it is possible to sufficiently ensure the function of holding and securing the vapor deposition mask 100 on the work in the vapor deposition step by adjusting the size, number and arrangement method of the island-like portions 24.

The metal layer 20 may be a plating layer or a metal foil formed on the resin layer 10.

There is no particular limitation on the thickness d of the metal layer 20. Note however that when the metal layer 20 is too thin, the attraction force received from the magnetic field of the magnetic chuck will decrease, and it will be difficult to hold the vapor deposition mask 100 on the work in the vapor deposition step. Therefore, it is preferred that the thickness of the metal layer 20 is 5 μm or more. On the other hand, in order to more easily form the metal layer 20 including the island-like portions 24, the metal layer 20 may be 20 μm or less, and preferably 10 μm or less, for example. Also in order to suppress shadowing in the vapor deposition step, the thickness d of the metal layer 20 is preferably 20 μm or less.

The ratio w/d between the width w of the island-like portions 24 and the height of the island-like portions 24 (i.e., the thickness d of the metal layer 20) is preferably less than 1, and more preferably ½ or less. Particularly, when αM>αR, by reducing the width w of the island-like portions 24 to be less than the height d of the island-like portions 24, it is possible to more effectively suppress the positional misalignment of the openings 13 due to the difference in thermal expansion between the metal material and the vapor deposition substrate while ensuring the attraction force for holding the vapor deposition mask 100. In view of this, the width w of the island-like portions 24 may be 5 μm or more and 10 μm or less, for example.

The island-like portions 24 may be in a columnar shape such as a prism shape or a circular cylindrical shape. Alternatively, the island-like portions 24 may be in a tapered shape, e.g., a truncated cone shape. The plurality of island-like portions 24 may include different types of island-like portions that are different from each other in terms of shape, size, etc. For example, the width of the island-like portions 24 may decreased in the vicinity of the openings 13 and increased in the vicinity of the frame 40.

The frame 40 is formed from a magnetic metal, for example. Alternatively, it may be formed from a non-metal material, e.g., a resin (plastic). With conventional vapor deposition masks, the frame was required to have an adequate rigidity so that the frame would not be deformed or broken by the tension from the layered film (a resin film and a metal film) secured on the frame due to the stretching step. Therefore, a frame made of an invar having a thickness of 20 mm, for example, was used. In contrast, according to the present embodiment, since the frame 40 is attached without applying tension on the resin layer 10 and the metal layer 20 (without performing the stretching step), there is no tension on the frame 40 due to the stretching step. Therefore, it is possible to use a frame 40 having a lower rigidity as compared with conventional methods, increasing the degree of freedom in selecting the material of the frame 40. It is also possible to make the frame 40 thinner as compared with conventional methods. Using a frame that is thinner as compared with conventional methods or using a frame made of a resin, it is possible to obtain the vapor deposition mask 100 that has a light weight and a good handling property.

<Other Structure Examples of Vapor Deposition Mask>

There is no limitation on the metal layer 20 of the present embodiment as long as it includes the mask portion 20a including the solid portion $20a_{(1)}$ and the hollow portion $20a_{(2)}$, and the peripheral portion 20b arranged so as to surround the mask portion 20a, and the metal layer 20 does not need to have an island-like structure as shown in FIG. 1.

Referring to FIG. 2 to FIG. 9, another example of a vapor deposition mask according to the present embodiment will now be described. In FIG. 2 to FIG. 9, like components to those of FIG. 1 are denoted by like reference signs. In the following description, only differences from the vapor deposition mask 100 will be described.

Figure 2:
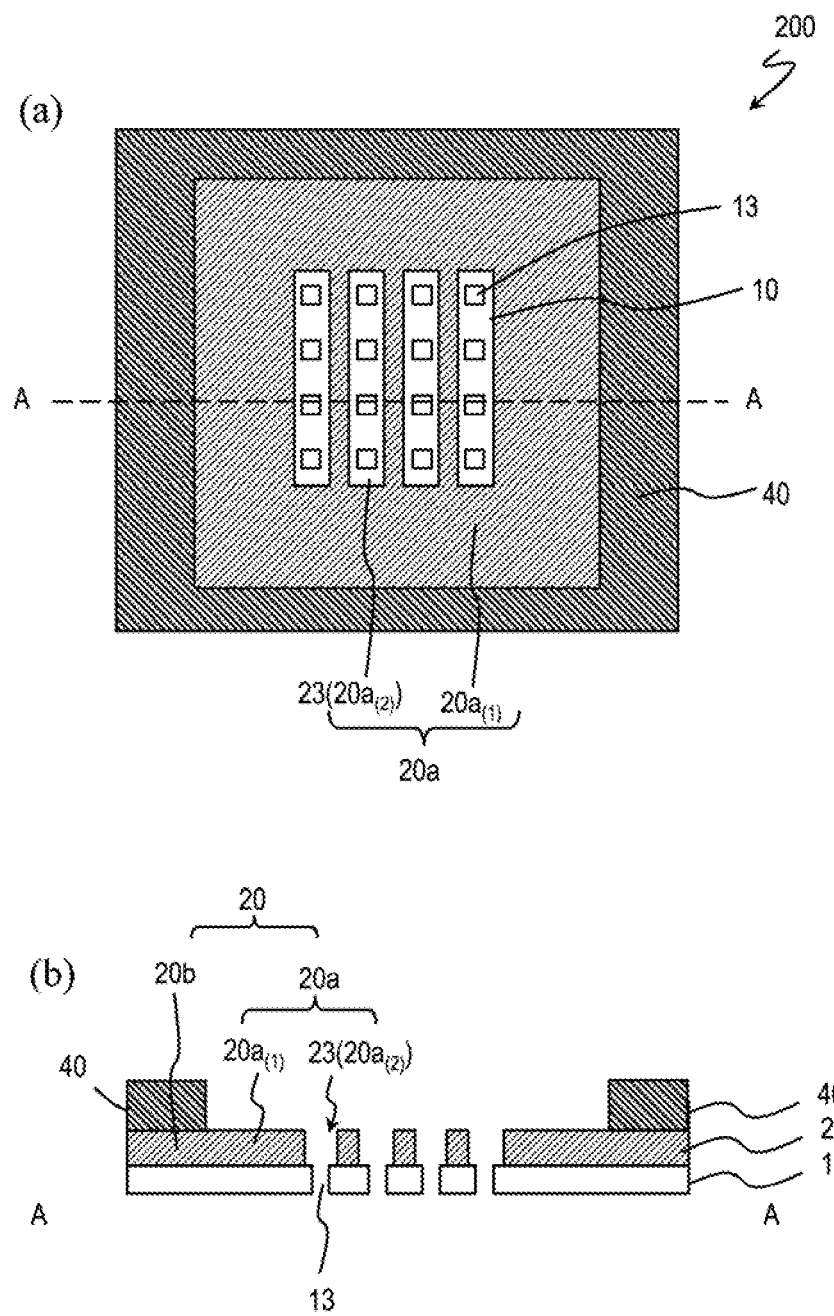
FIG. 2 (a) is a plan view schematically showing another vapor deposition mask 200 according to the first embodiment of the present invention, and (b) is a cross-sectional view taken along line A-A of FIG. 2(a).

FIGS. 2(*a*) and 2(*b*) are a cross-sectional view and a plan view, schematically showing another vapor deposition mask 200 of the present embodiment. FIG. 2(*b*) shows a cross section taken along line A-A of FIG. 2(*a*).

With the vapor deposition mask 200, the metal layer 20 includes the peripheral portion 20b to which the frame 40 is secured, and the mask portion 20a having a plurality of slits (openings) 23 therein. That is, the hollow portion $20a_{(2)}$ of the mask portion 20a is the plurality of slits 23. The solid portion $20a_{(1)}$ and the peripheral portion 20b of the mask portion 20a are not separated from each other, but are formed integrally together. In the example shown in FIG. 2, the slits 23, each extending in the column direction, are arranged in the row direction. As seen from the direction normal to the vapor deposition mask 200, the size of the slit 23 is greater than that of each opening 13 of the resin layer 10, and there are two or more openings 13 (needless to say, the number of openings 13 is not limited to that shown in FIG. 2) in each slit 23.

Figure 3:
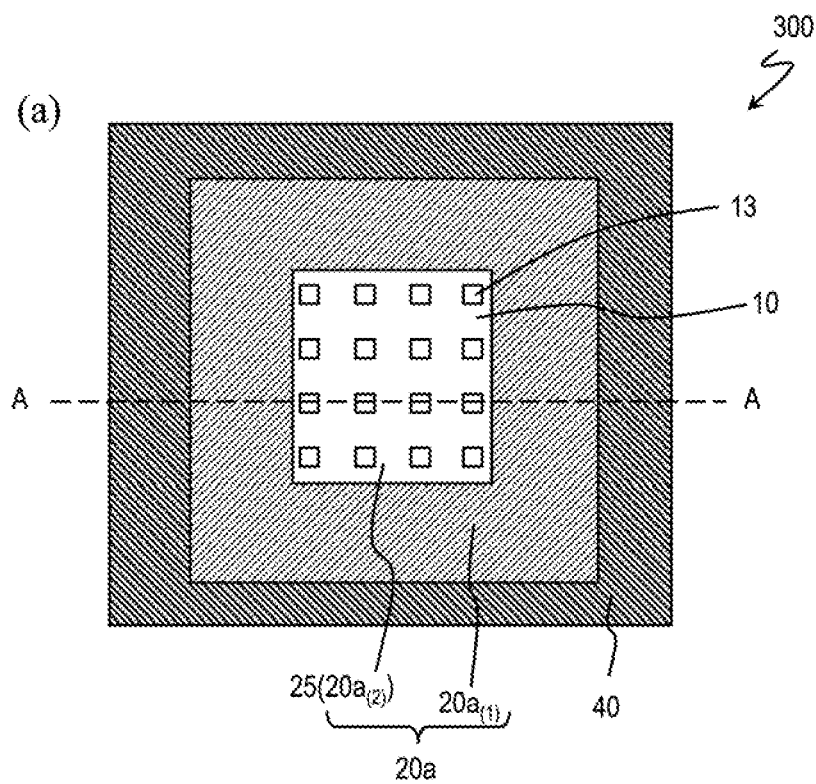
FIG. 3 (a) is a plan view schematically showing another vapor deposition mask 300 according to the first embodiment of the present invention, and (b) is a cross-sectional view taken along line A-A of FIG. 3(a).
Figure 3:
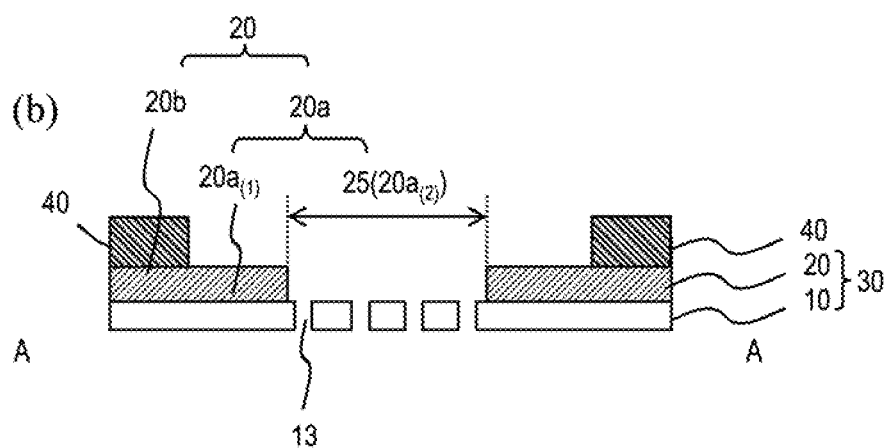

FIGS. 3(*a*) and 3(*b*) are a cross-sectional view and a plan view, schematically showing another vapor deposition mask 300 of the present embodiment. FIG. 3(*b*) shows a cross section taken along line A-A of FIG. 3(*a*).

With the vapor deposition mask 300, the metal layer 20 includes the peripheral portion 20b to which the frame 40 is secured, and the mask portion 20a with an opening 25 formed therein. That is, the hollow portion $20a_{(2)}$ of the mask portion 20a is the opening 25. A plurality of openings 13 used for the formation of one device (e.g., an organic EL display), for example, are located in the opening 25. The solid portion $20a_{(1)}$ is formed in a frame-like shape only around the plurality of openings 13. The solid portion 20a(1) and the peripheral portion 20b are formed integrally together.

Figure 4:
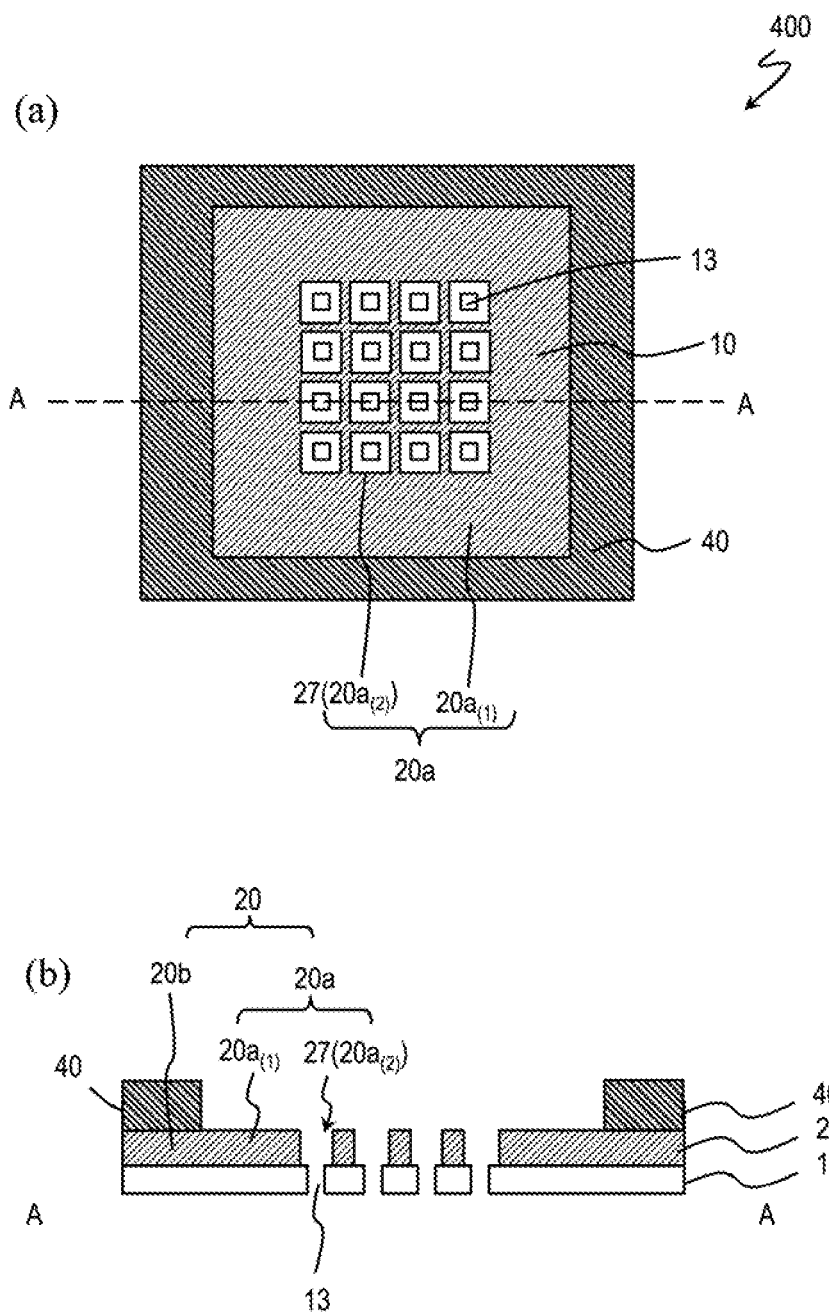
FIG. 4 (a) is a plan view schematically showing another vapor deposition mask 400 according to the first embodiment of the present invention, and (b) is a cross-sectional view taken along line A-A of FIG. 4(a).

FIGS. 4(*a*) and 4(*b*) are a cross-sectional view and a plan view, schematically showing another vapor deposition mask 400 of the present embodiment. FIG. 4(*b*) shows a cross section taken along line A-A of FIG. 4(*a*).

With the vapor deposition mask 400, the metal layer 20 includes the peripheral portion 20b to which the frame 40 is secured, and the mask portion 20a having a plurality of through holes (openings) 27 therein. That is, the hollow portion $20a_{(2)}$ of the mask portion 20a is the plurality of through holes 27. In the example shown in FIG. 4, the through holes 27 are arranged in a matrix array, and each through hole 27 has a larger size than each opening 13 of the resin layer 10. One opening 13 is located in each through hole 27. The solid portion $20a_{(1)}$ of the mask portion 20a is in a lattice shape, and is formed integrally with the peripheral portion 20b.

With the vapor deposition masks 200, 300 and 400, the solid portion $20a_{(1)}$ of the metal layer 20 extends across the entire width of the mask portion 20a, and is connected to the peripheral portion 20b. Therefore, in order to suppress the positional misalignment of the openings 13 due to the thermal expansion of the metal layer 20 in the vapor deposition step, it is preferred that a material having a relatively small linear thermal expansion coefficient αM (αM: less than 6 ppm/° C., for example) is used as the material of the metal layer 20. When a metal material having a small linear thermal expansion coefficient αM is used, the solid portion $20a_{(1)}$ of the metal layer 20 may account for over ½ of the entire area of the mask portion 20a (SM>50%). For example, the linear thermal expansion coefficient αM may be similar to the linear thermal expansion coefficient of the vapor deposition substrate or the linear thermal expansion coefficient αR of the resin film of the resin layer 10. Note that when the temperature increase is small (less than 3° C., for example) in the vapor deposition step, and/or when the metal layer 20 and the resin layer 10 are designed taking into account the amount of positional misalignment occurring in the vapor deposition step, it is possible to use a material having a relatively large linear thermal expansion coefficient αM such as Ni as listed above.

In the vapor deposition mask 200, it is preferred that the width (area) of the portion of the solid portion $20a_{(1)}$ of the metal layer 20 that is located between two adjacent slits 23 is set to be within such a range that it is possible to suppress shadowing in the vapor deposition step. The details will be described later.

Figure 5:
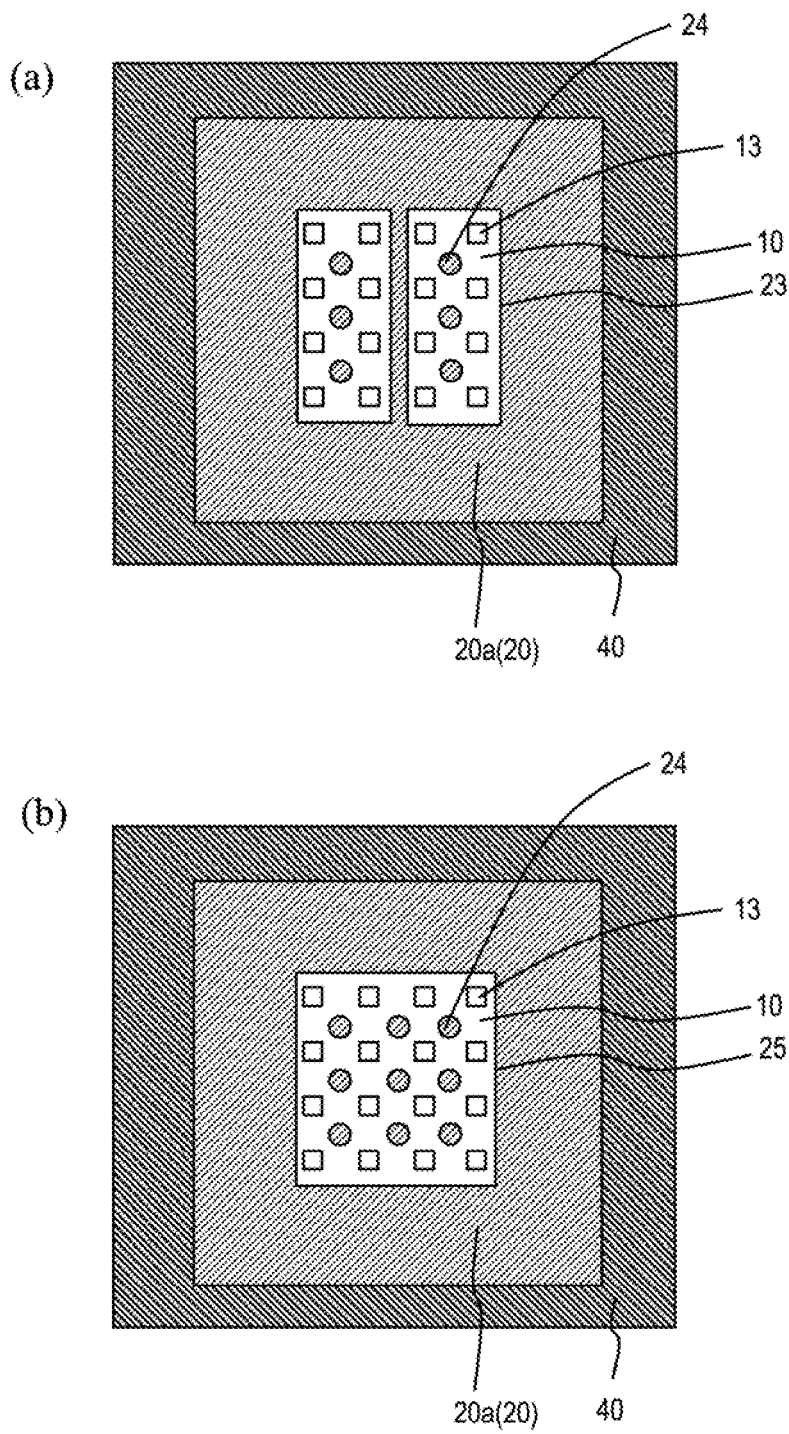
FIGS. 5 (a) and (b) are plan views each showing a variation of the vapor deposition mask according to the first embodiment of the present invention.
Figure 6:
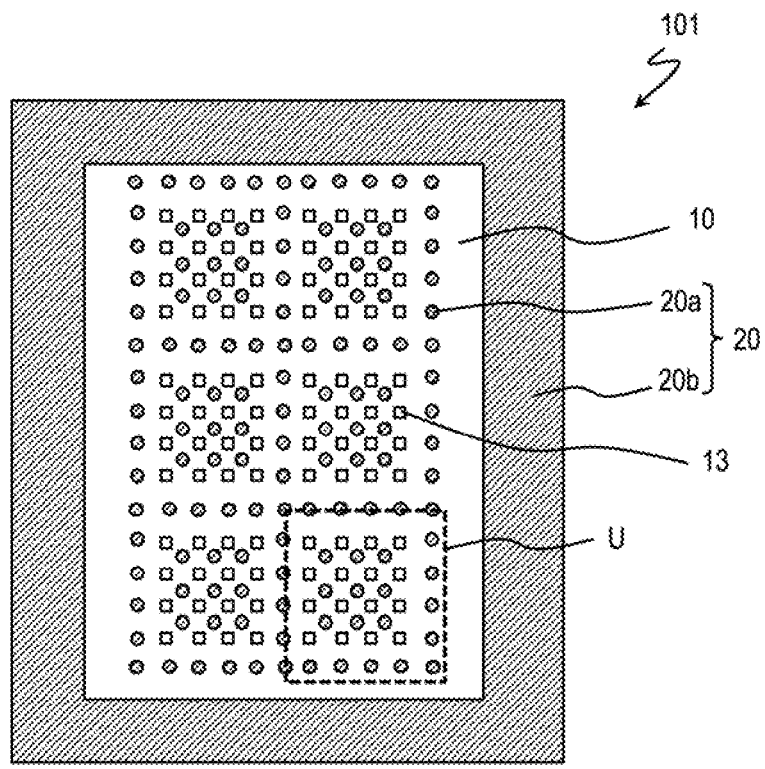
FIG. 6 A plan view schematically showing another vapor deposition mask 101 according to the first embodiment of the present invention.
Figure 7:
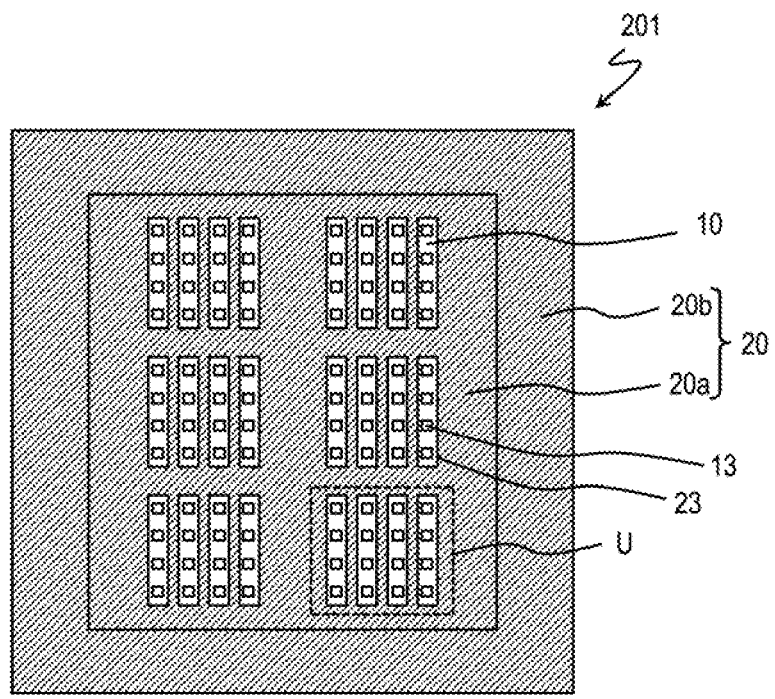
FIG. 7 A plan view schematically showing another vapor deposition mask 201 according to the first embodiment of the present invention.
Figure 8:
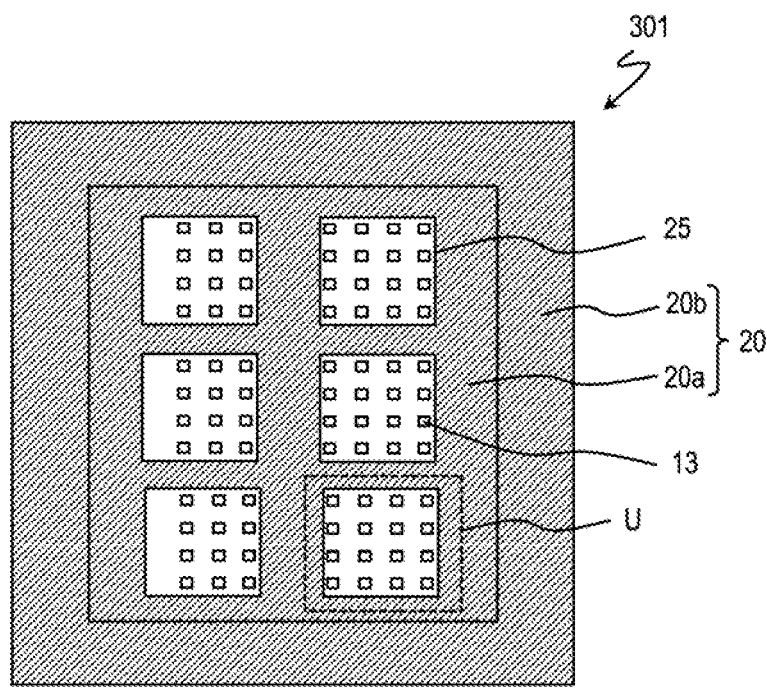
FIG. 8 A plan view schematically showing another vapor deposition mask 301 according to the first embodiment of the present invention.
Figure 9:
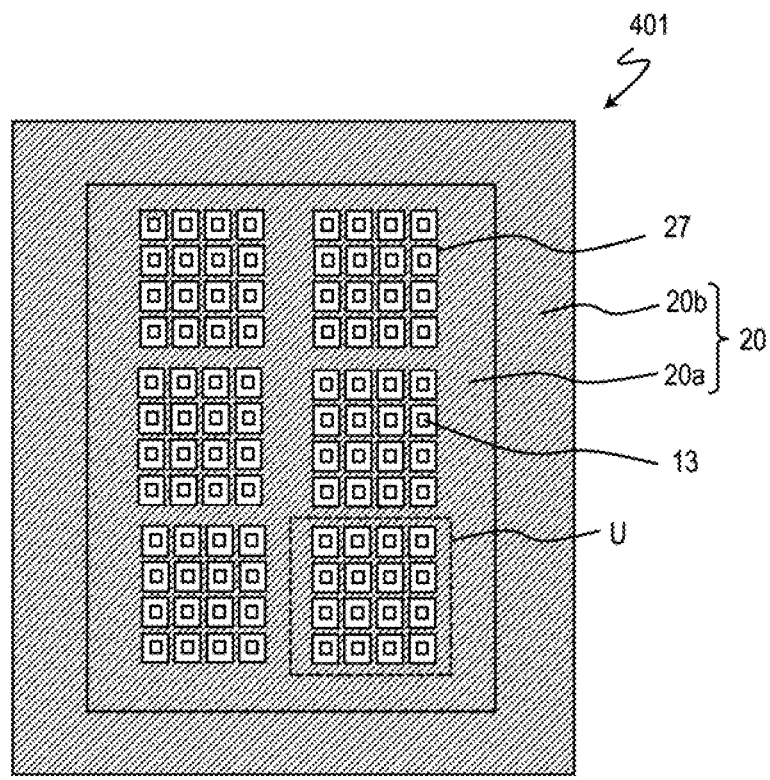
FIG. 9 A plan view schematically showing another vapor deposition mask 401 according to the first embodiment of the present invention.

The structure of the metal layer 20 in the vapor deposition mask of the present embodiment is not limited to the example shown in FIG. 1 to FIG. 4. FIGS. 5(*a*) and 5(*b*) are plan views each showing another example of the metal layer 20. As shown in the figure, the mask portion 20a of the metal layer 20 may include both the slits 23 or the opening 25, and the island-like portions 24 arranged inside the slits 23 or the opening 25.

The vapor deposition mask of the present embodiment may have a structure in which unit regions U, each corresponding to one device (e.g., an organic EL display), are arranged in a two-dimensional array. A vapor deposition mask having such a structure can suitably be used for forming a plurality of devices on one vapor deposition substrate.

FIG. 6 to FIG. 9 are plan views illustrating still other vapor deposition masks 101, 201, 301 and 401, respectively, of the present embodiment. These vapor deposition masks include a plurality of (herein, 6) unit regions U spaced apart from each other, as seen from the normal direction. In each unit region U, the resin layer 10 has a plurality of openings 13, and the mask portion 20a of the metal layer 20 has a shape similar to the mask portion 20a of the vapor deposition masks 100, 200, 300 and 400 (FIG. 1 to FIG. 4), respectively. Although not shown in the figures, a frame is provided on the peripheral portion 20b of the metal layer so as to surround these unit regions U. Note that the number and arrangement method of unit regions U, and the number and arrangement method of the openings 13 in each unit region U, are dictated by the configuration of the device to be manufactured and not limited to those of the illustrated examples.

<Method for Manufacturing Vapor Deposition Mask>

Referring to FIG. 10 to FIG. 16, a method for manufacturing a vapor deposition mask of the present embodiment will be described using, as an example, a method for manufacturing the vapor deposition mask 101. In FIG. 10 to FIG. 16, (a) and (b) are a plan view and a cross-sectional view, respectively, showing a step of a method for manufacturing the vapor deposition mask 101.

Figure 10:
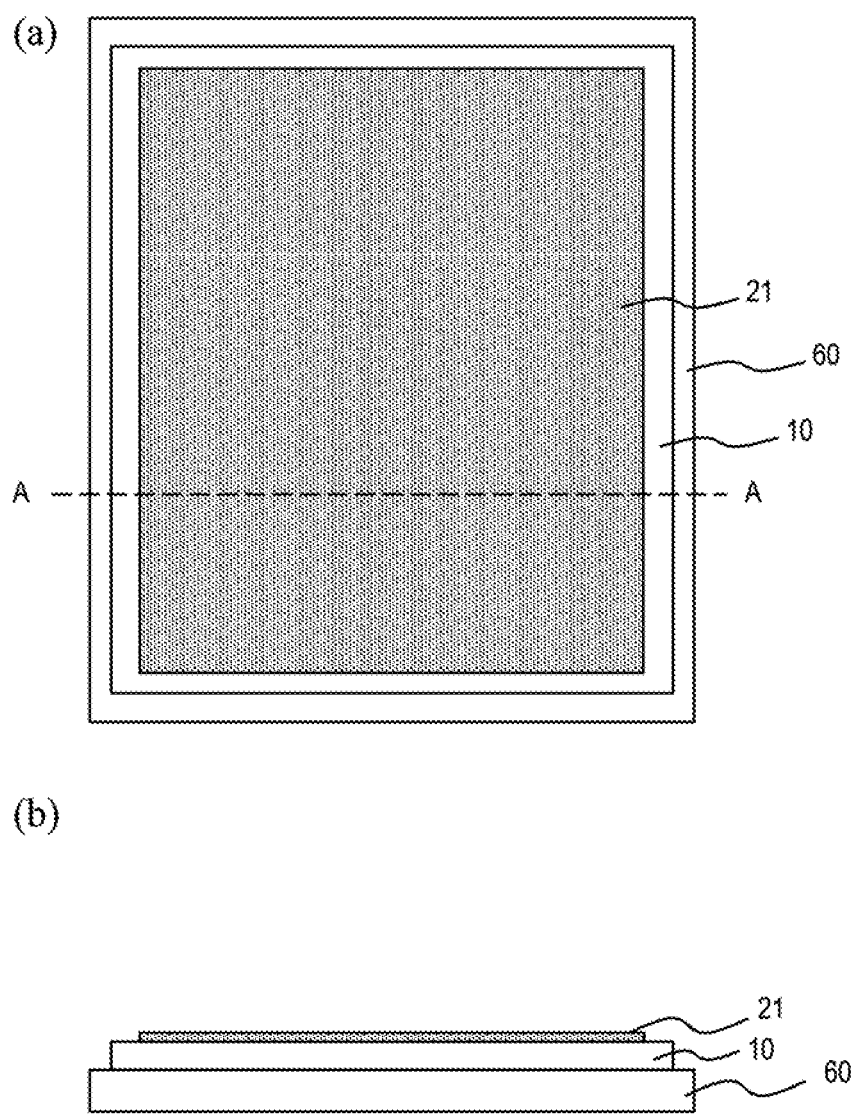
FIGS. 10 (a) and (b) are a plan view and a cross-sectional view, respectively, illustrating a step of a method for manufacturing a vapor deposition mask according to the first embodiment of the present invention.

First, as shown in FIG. 10, a support substrate 60 is provided, and the resin layer 10 is formed on the support substrate 60. For example, a glass substrate can suitably be used as the support substrate 60. There is no particular limitation on the size and thickness of the glass substrate. Herein, a glass substrate is used that has a size of 620 mm×375 mm and a thickness of 0.5 mm.

The resin layer 10 is formed as follows. First, a solution (e.g., a polyimide precursor solution) including a precursor of a resin material or a solution (e.g., a soluble-type polyimide solution) including a resin material is applied on the support substrate 60. The method for applying a solution may be a method known in the art such as a spin coating method or a slit coater method. Herein, polyimide is used as the resin material, and a solution (a polyimide precursor solution) including polyamic acid, which is a precursor of polyimide, is applied on the support substrate 60 by a spin coating method. Then, baking and curing are performed to from a polyimide layer as the resin layer 10. The curing temperature can be set to 300° C. or more, e.g., 400° C. or more and 500° C. or less. It is preferred that the curing condition is adjusted so that the linear thermal expansion coefficient $\alpha R$ of the resin film is similar to the linear thermal expansion coefficient $\alpha W$ of the substrate to be the vapor deposition object (e.g., 3 to 5 ppm/° C.).

When the curing temperature is 450° C., the temperature profile for suppressing the linear thermal expansion coefficient $\alpha R$ of the resin film to be similar to the linear thermal expansion coefficient $\alpha W$ of the substrate to be the vapor deposition object can be set so as to satisfy at least one of (1) to (3) below, for example.

(1) first increase the temperature to close to 500° C. and leave for about 10 to 60 min, and then cure at 450° C.

(2) cure at about 450° C., and then hold the temperature for 30 min or more.

(3) use a temperature profile that includes a step with a large temperature increase (a step of significantly increasing the temperature and holding the temperature for a long time). An example of the temperature profile is a profile in which the temperature in the chamber in which the support substrate 60 is placed is increased stepwise by 10° C. to 200° C. for each passage of 5 to 120 min to a predetermined curing temperature.

Instead of a polyimide precursor solution, a solution including a solvent-soluble polyimide (polymer) (soluble-type polyimide solution) may be applied on the support substrate 60 and baked to form the resin layer 10. While there is no particular limitation on the baking temperature, which may be appropriately selected based on the boiling point of the solvent, it is 100° C. to 320° C., and preferably 120° C. to 250° C., for example. The baking time is about 1 sec to about 360 min.

Then, a conductive metal film 21 is formed on the resin layer 10. The conductive metal film 21 is formed by a known method such as vapor deposition, a sputtering method and electroless plating. The conductive metal film 21 may be any film that is conductive, and may be a Cu film, an Al film, a Ti film, or the like. The conductive metal film 21 may be any film that functions as a seed layer when forming a metal layer to be described later by an electrolytic plating method, and may be sufficiently thinner than the metal layer (e.g., less than or equal to 1/10 the thickness of the metal layer). Herein, a Cu film (thickness: 0.1 μm) is formed as the conductive metal film 21.

Figure 11:
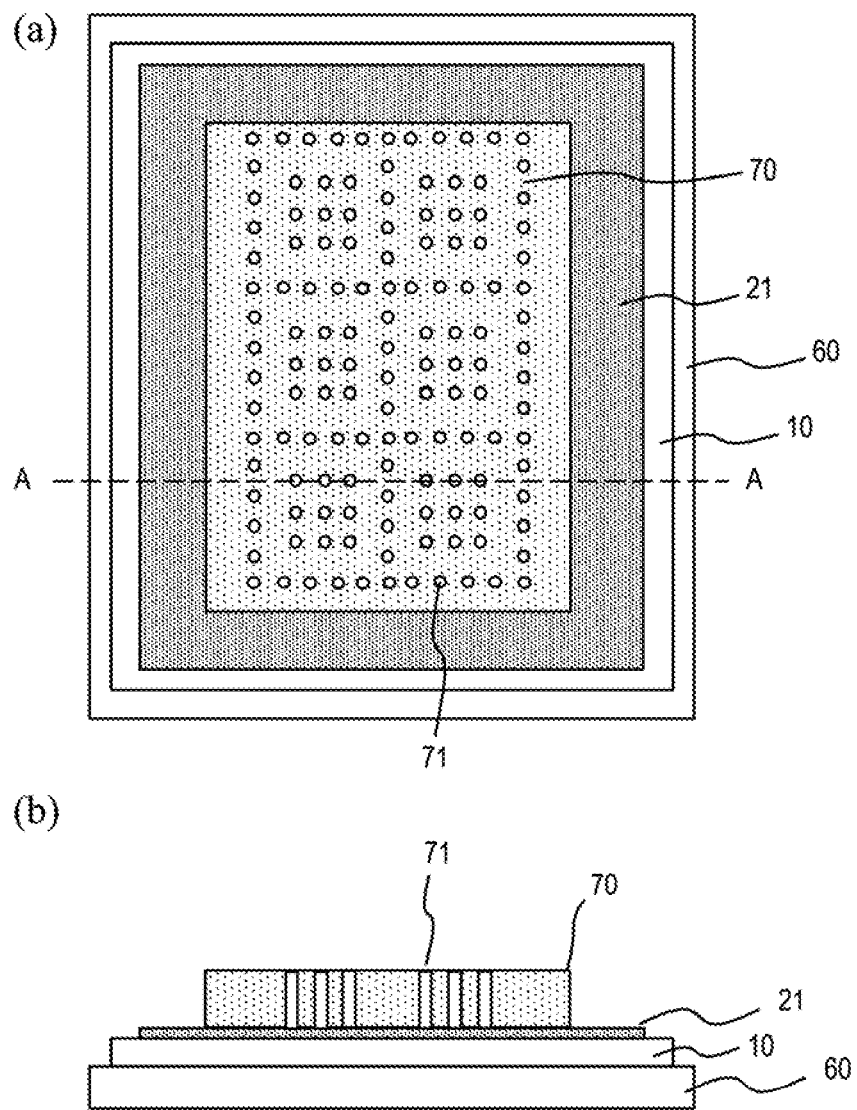
FIGS. 11 (a) and (b) are a plan view and a cross-sectional view, respectively, illustrating a step of the method for manufacturing a vapor deposition mask according to the first embodiment of the present invention.

Next, as shown in FIG. 11, a photoresist film is formed on the conductive metal film 21, and the photoresist film is patterned through exposure and development, thereby obtaining a resist layer 70 that is shaped corresponding to the hollow portion of the mask portion 20a (FIG. 1). In the present embodiment, the resist layer 70 has a plurality of openings 71 corresponding to the plurality of island-like portions 24 (FIG. 1). Thus, portions of the conductive metal film 21 (around the resist layer 70 and inside the openings 71) are exposed by the resist layer 70.

Figure 12:
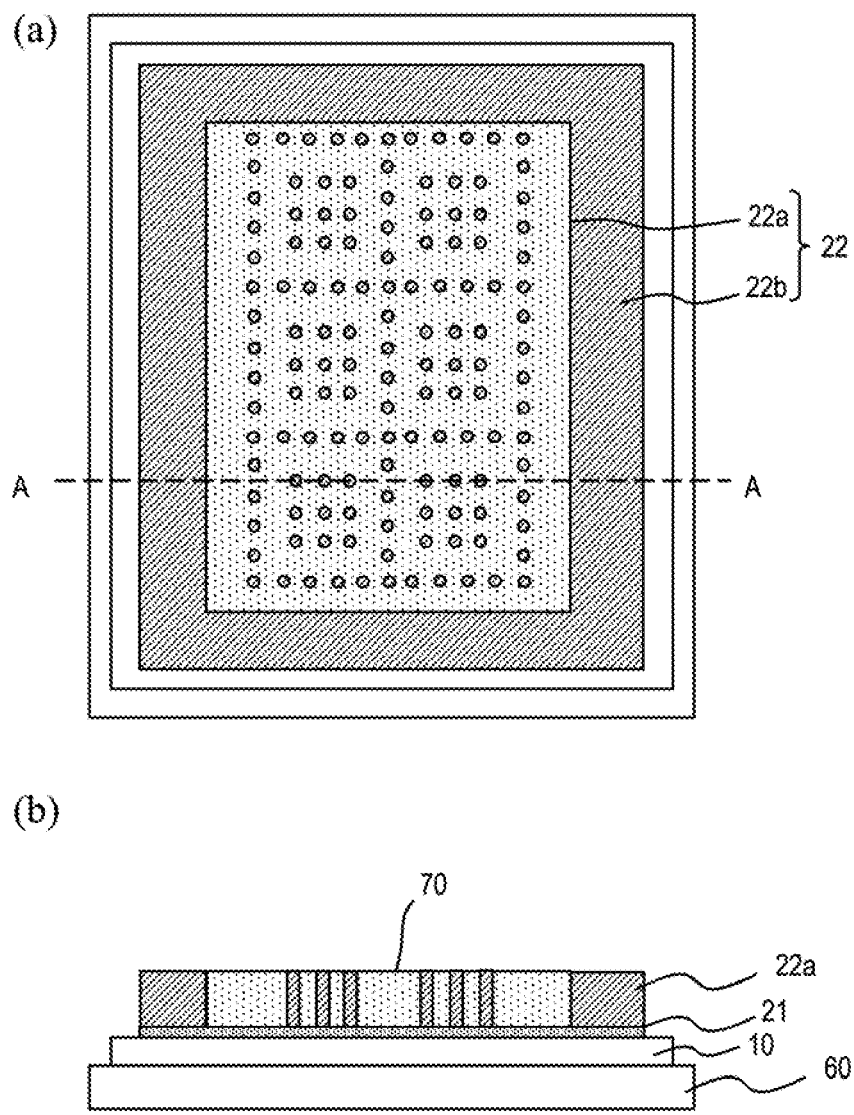
FIGS. 12 (a) and (b) are a plan view and a cross-sectional view, respectively, illustrating a step of the method for manufacturing a vapor deposition mask according to the first embodiment of the present invention.

Then, as shown in FIG. 12, a main metal film 22 is formed around the resist layer 70 and inside the openings 71 by an electrolytic plating method in which the conductive metal film 21 is used as an electrode. The material and thickness of the main metal film 22 may be the same as the material and thickness of the metal layer 20 described above. Herein, an Ni layer (thickness: 10 μm) is formed as the main metal film 22.

Note that the conductive metal film 21 may not be formed. In such a case, after the resist layer 70 is formed on the resin layer 10, the metal layer 20 (here, an Ni layer) may be formed by an electroless plating method on portions of the resin layer 10 that are exposed by the resist layer 70.

Figure 13:
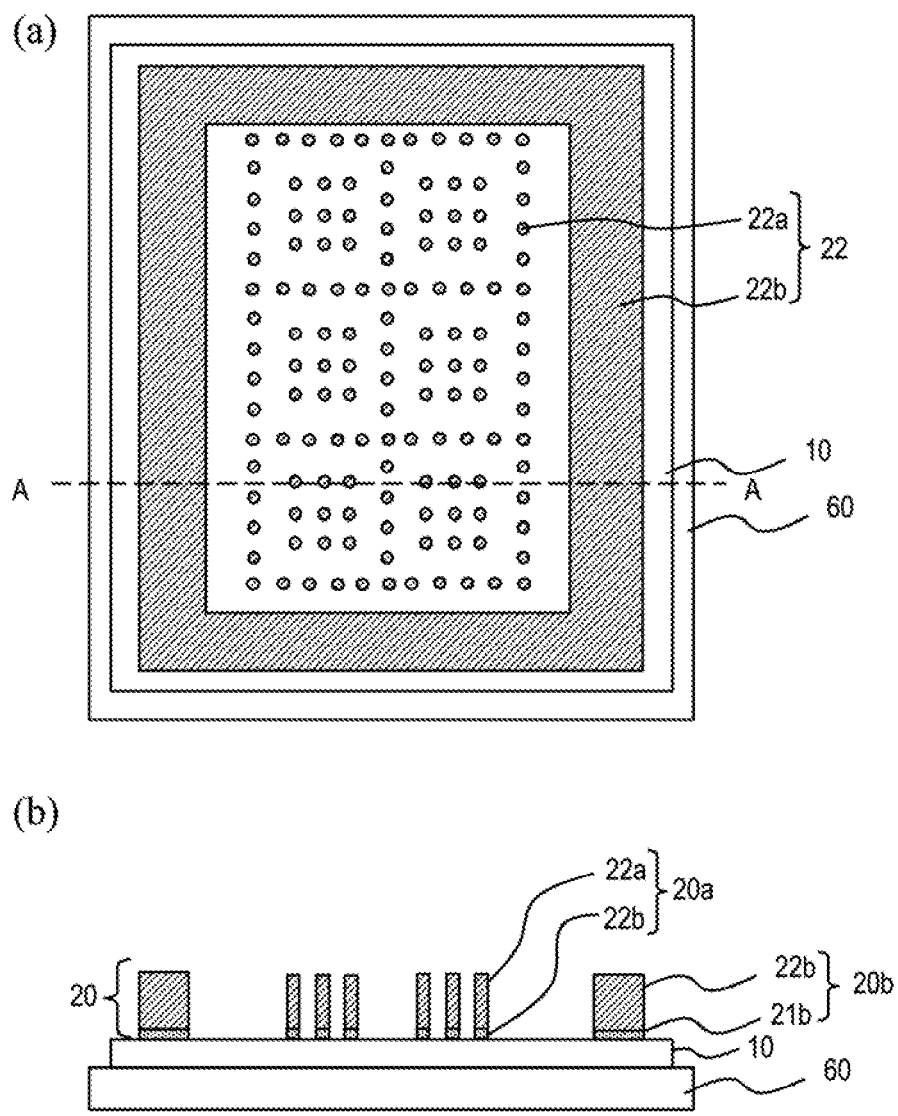
FIGS. 13 (a) and (b) are a plan view and a cross-sectional view, respectively, illustrating a step of the method for manufacturing a vapor deposition mask according to the first embodiment of the present invention.

Then, as shown in FIG. 13, the resist layer 70 is removed, and portions of the conductive metal film 21 that are not covered by the main metal film 22 are removed by etching. Etching of the conductive metal film 21 uses an etchant that corrodes the metal of the conductive metal film 21 and does not corrode the metal of the main metal film 22 (the etch rate ratio is 100:1 or more, for example). Herein, CuE-3000M from Wako Pure Chemical Industries is used as the etchant. Thus, the metal layer 20 is formed that is composed of the conductive metal film 21 and the main metal film 22, and that exposes portions of the resin layer 10. The metal layer 20 includes the peripheral portion 20b and the plurality of island-like portions 24. Portions of the resin layer 10 that are located inside the peripheral portion 20b and are not in contact with the island-like portions 24.

Note that in this example, the metal layer 20 has a layered structure of the main metal film 22 and the conductive metal film 21. However, since the conductive metal film 21 is sufficiently thinner than the main metal film 22, the linear thermal expansion coefficient of the material of the main metal film 22 may be used as the linear thermal expansion coefficient $\alpha M$ of the metal material when calculating the area ratio SM of the island-like portions 24.

Figure 14:
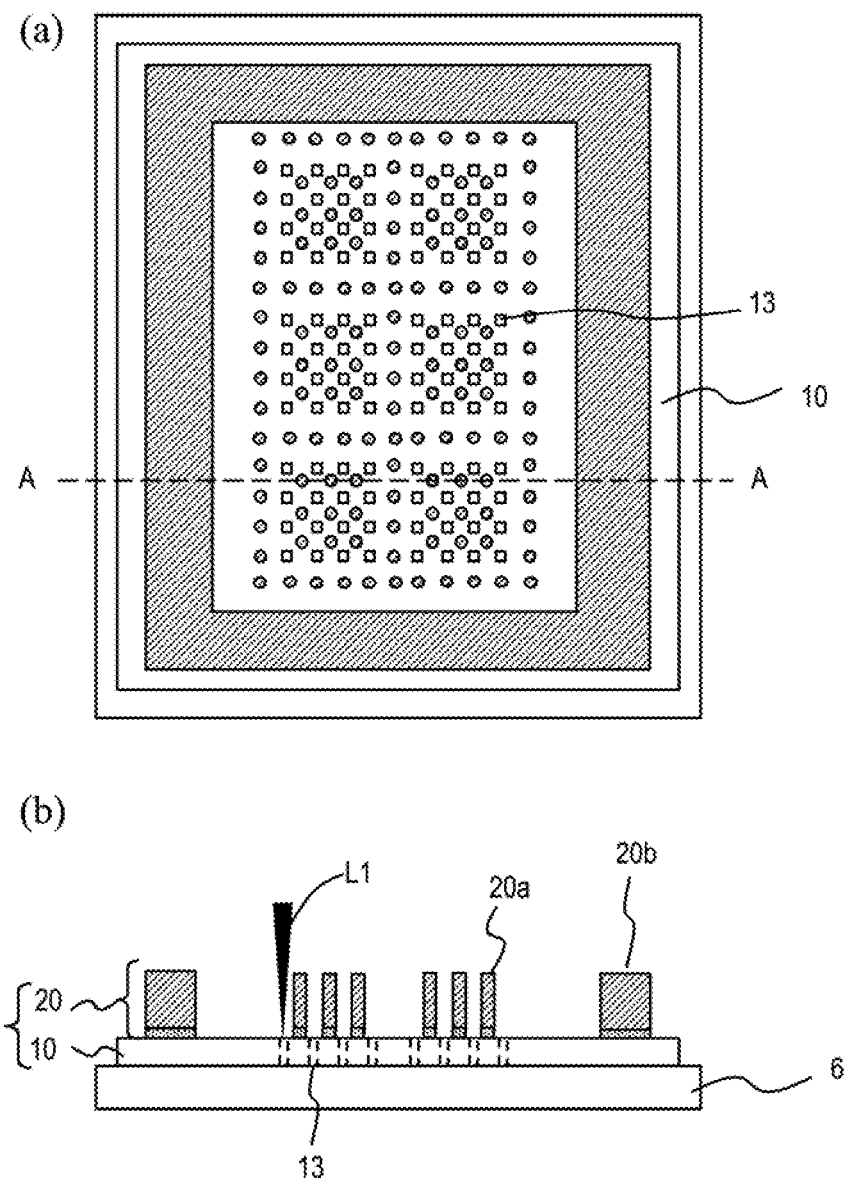
FIGS. 14 (a) and (b) are a plan view and a cross-sectional view, respectively, illustrating a step of the method for manufacturing a vapor deposition mask according to the first embodiment of the present invention.

Next, as shown in FIG. 14, by a laser ablation method, for example, the plurality of openings 13 are formed in portions of the resin layer 10 that are exposed through the metal layer 20 (the laser process step). Thus, the mask member 30 including the metal layer 20 and the resin layer 10 is obtained.

A pulse laser is used for the laser process on the resin layer 10. Herein, a YAG laser is used, and a predetermined region of the resin layer 10 is irradiated with a laser beam L1 having a wavelength of 355 nm (the third harmonic). The energy density of the laser beam L1 is set to 0.36 J/cm$^2$, for example. As described above, the laser process on the resin layer 10 is performed in a plurality of shots while focusing the laser beam L1 on the surface of the resin layer 10. The shot frequency is set to 60 Hz, for example. Note that the conditions of the laser process (the wavelength of the laser beam, the irradiation conditions, etc.) are not limited to those described above, but can be selected appropriately so that the resin layer 10 can be processed.

In the present embodiment, a laser process is performed on the resin layer 10 formed by curing (or baking) on the support substrate 60. Since no bubble exists between the support substrate 60 and the resin layer 10, it is possible to form the openings 13 of an intended size with a higher precision as compared with conventional methods, and the occurrence of burrs (see FIG. 25) is also suppressed.

Figure 15:
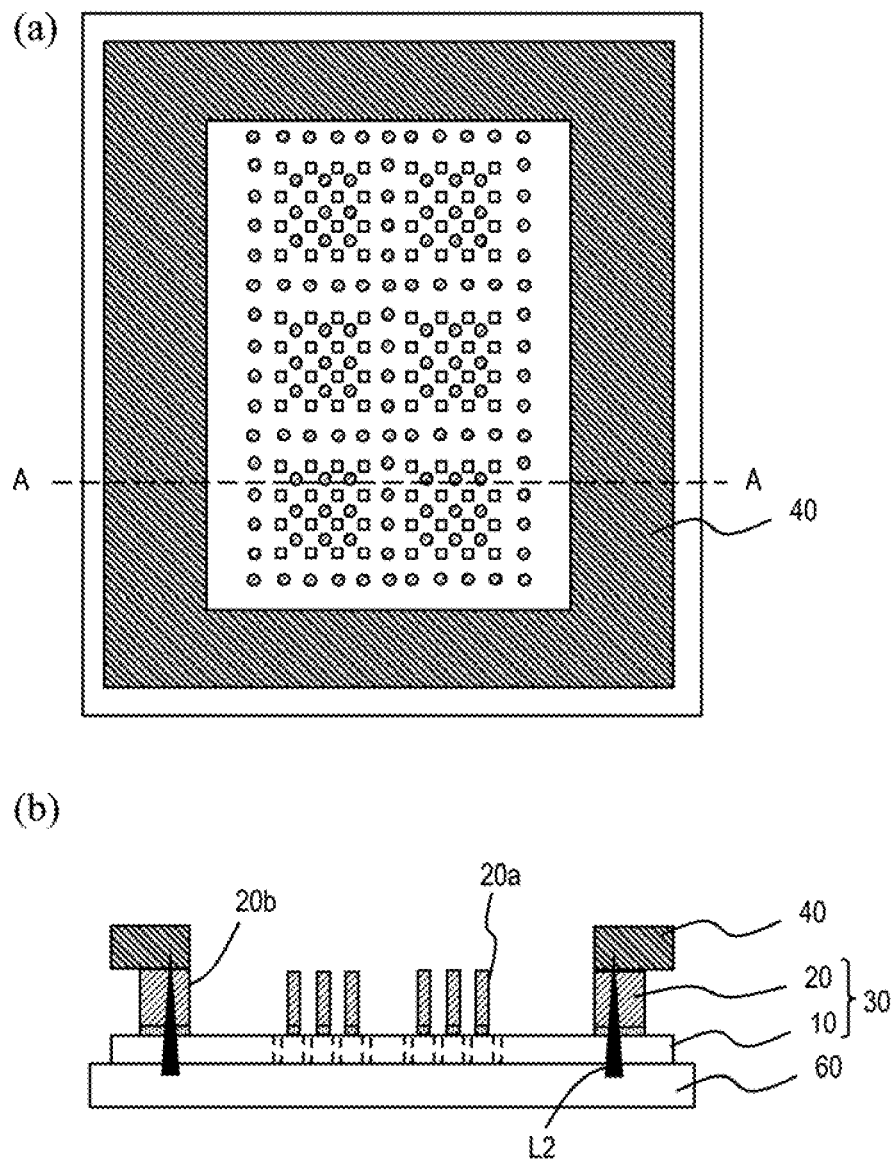
FIGS. 15 (a) and (b) are a plan view and a cross-sectional view, respectively, illustrating a step of the method for manufacturing a vapor deposition mask according to the first embodiment of the present invention.

Then, as shown in FIG. 15, the frame 40 is secured on the mask member 30 (the frame attachment step). Herein, the frame 40 is placed on the peripheral portion 20b of the metal layer 20, and the peripheral portion 20b and the frame 40 are attached together. The frame 40 is formed from a magnetic metal such as an invar, for example. The peripheral portion 20b of the metal layer 20 and the frame 40 are welded together by irradiating with a laser beam L2 from the support substrate 60 side (spot welding). The pitch of the spot welding can be selected appropriately. In this example, the inner edge portion of the frame 40 and the inner edge portion of the peripheral portion 20b of the metal layer 20 are generally aligned together as seen from a direction normal to the support substrate 60, but a portion of the peripheral portion 20b may be exposed on the inner side of the frame 40. Alternatively, the frame 40 may cover the entire peripheral portion 20b and a portion of the resin layer 10.

As described above, in the present embodiment, the step of securing the resin layer 10 and the metal layer 20 on the frame 40 while stretching them in a predetermined layer plane direction(s) (the stretching step) is not performed, it is possible to use the frame 40 having a lower rigidity as compared with conventional methods. Therefore, the frame 40 may be formed from a resin such as ABS (acrylonitrile butadiene styrene) and PEEK (polyether ether ketone). The method for attaching together the mask member 30 and the frame 40 is not limited to laser welding. For example, the peripheral portion 20b of the metal layer 20 and the frame 40 may be attached together by using an adhesive.

Figure 16:
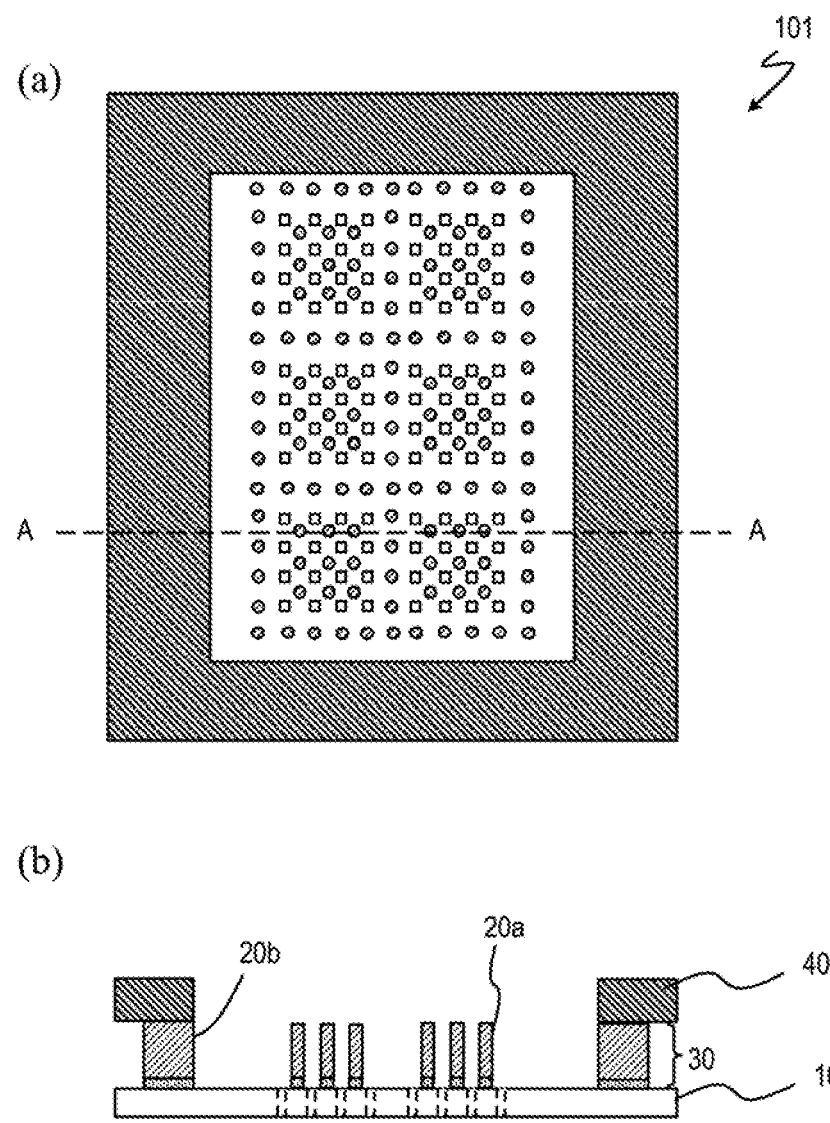
FIGS. 16 (a) and (b) are a plan view and a cross-sectional view, respectively, illustrating a step of the method for manufacturing a vapor deposition mask according to the first embodiment of the present invention.

Next, as shown in FIG. 16, the resin layer 10 is removed from the support substrate 60. The removing of the resin layer 10 can be done by a laser lift off method, for example. When the adhesion force between the resin layer 10 and the support substrate 60 is relatively weak, the removing can be done mechanically by using a knife edge, or the like.

Herein, the resin layer 10 is removed from the support substrate 60 by irradiating with a laser beam (wavelength: 308 nm) from the support substrate 60 side by using an XeCl excimer laser, for example. Note that it is only required that the laser beam be light of a wavelength that passes through the support substrate 60 and is absorbed by the resin layer 10, and a high power laser such as another excimer laser or a YAG laser may be used. The vapor deposition mask 101 is manufactured as described above.

Thereafter, as necessary, a magnetization step of magnetizing the metal layer 20 with an electromagnetic coil is performed, adjusting the residual magnetic flux density of the metal layer 20 to 10 mT or more and 1000 mT, for example. Note that the magnetization step does not need to be performed. Even if the magnetization step is not performed, the metal layer 20 is a magnetic member, and the vapor deposition mask 101 can be held on the work in the vapor deposition step by using a magnetic chuck.

While a method for forming the vapor deposition mask 101 has been described above as an example, the other vapor deposition masks 100, 200, 201, 300 and 301 can also be manufactured by a method similar to the method described above. Note however that the shape of the resist layer 70 needs to be changed to a shape that corresponds to the hollow portion of the mask portion 20a of these vapor deposition masks. Specifically, when manufacturing the vapor deposition masks 200 and 201, the resist layer 70 may be formed with a plurality of island-like patterns corresponding to the plurality of slits 23. When manufacturing the vapor deposition masks 300 and 301, the resist layer 70 may be formed with island-like patterns corresponding to one or more openings 25.

<Another Method for Manufacturing Vapor Deposition Mask>

Figure 17:
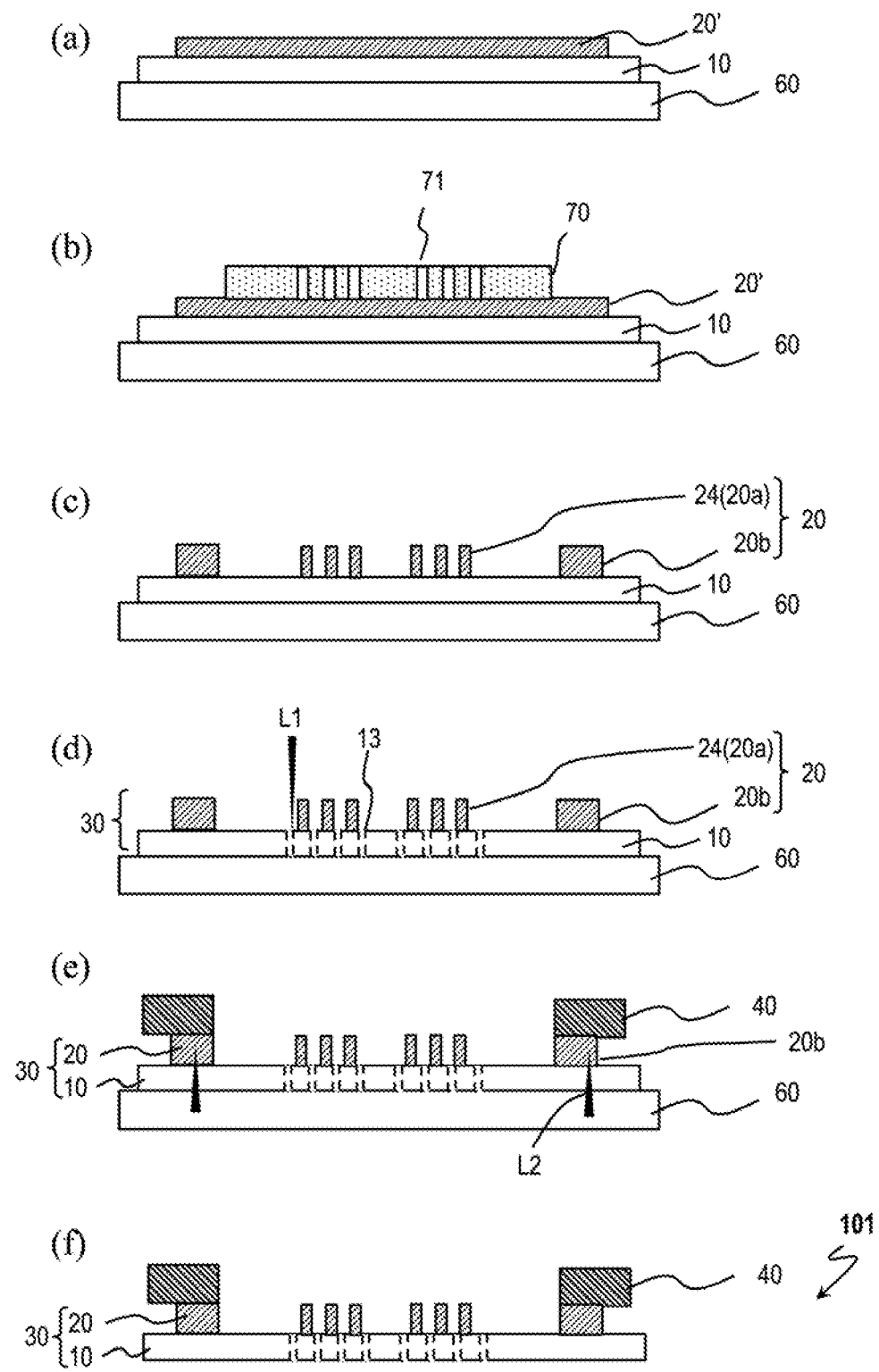
FIG. 17 (a) to (f) are cross-sectional views each showing a step of another method for manufacturing a vapor deposition mask according to the first embodiment of the present invention.
Figure 18:
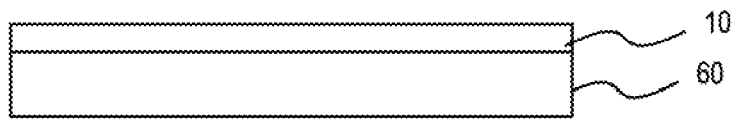
FIG. 18 (a) to (e) are cross-sectional views each showing a step of another method for manufacturing a vapor deposition mask according to the first embodiment of the present invention.
Figure 18:
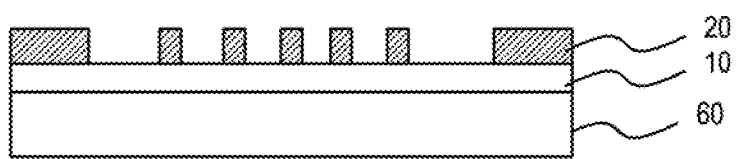
Figure 18:
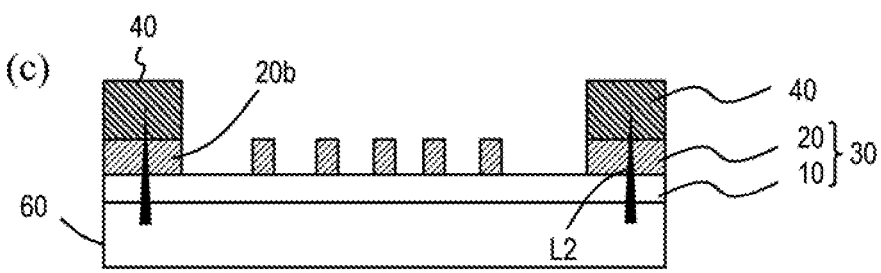
Figure 18:
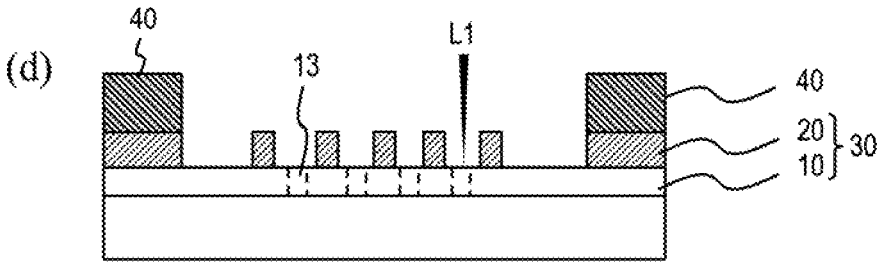
Figure 18:
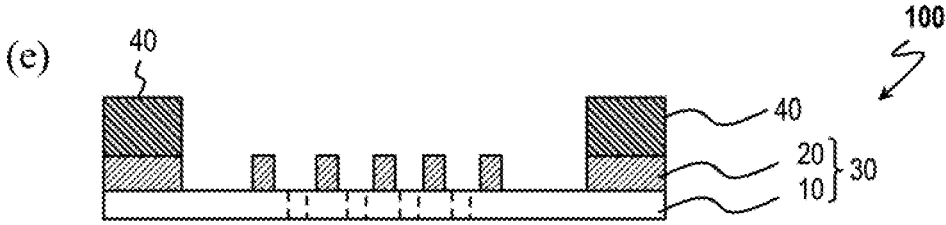

Referring to FIG. 17 and FIG. 18, other methods for manufacturing vapor deposition masks of the present embodiment will be described. In FIG. 17 and FIG. 18, like components to those of FIG. 10 to FIG. 16 are denoted by like reference signs. The following description will focus on differences from the method described above with reference to FIG. 10 to FIG. 16, and the method of formation, material, thickness, etc., of the layers will not be described below if they are similar to those of the method described above.

Although the metal layer 20 is formed by a plating method with the method described above with reference to FIG. 10 to FIG. 16, the metal layer 20 may be formed by patterning a metal foil.

FIGS. 17(*a*) to 17(*f*) are cross-sectional views each showing a step of another method for manufacturing a vapor deposition mask. Herein, a method for manufacturing the vapor deposition mask 101 will be described as an example, the other vapor deposition masks 100, 200, 201, 300, 301, 400 and 401 can also be manufactured by a similar method.

First, as shown in FIG. 17(*a*), the resin layer 10 is formed on the support substrate 60. The method for forming the resin layer 10 is similar to the method described above with reference to FIG. 10. Herein, a polyimide precursor solution is applied on the support substrate 60 and cured to form the resin layer 10. Next, a metal foil 20' is bonded to the upper surface of the resin layer 10 with an adhesive (a dry laminate or a thermal laminate). An Ni film, a Cr film, or the like, having a thickness of 5 μm or more and 10 μm or less, for example, can be used as the metal foil 20'.

Next, as shown in FIG. 17(*b*), a photoresist film is formed on the metal foil 20', and the photoresist film is patterned through exposure and development. The resist layer 70 shaped corresponding to the hollow portion of the mask portion is obtained as described above. The shape of the resist layer 70 as seen from above is the same as the shape shown in FIG. 11(*a*).

Then, as shown in FIG. 17(*c*), the metal foil 20' is patterned by using the resist layer 70 as a mask. Thereafter, the resist layer 70 is removed. The metal layer 20 including the peripheral portion 20b and the island-like portions 24 is obtained as described above.

Next, as shown in FIG. 17(*d*), the plurality of openings 13 are formed in the resin layer 10 by a laser process. Then, as shown in FIG. 17(*e*), the frame 40 is secured on the peripheral portion 20b of the metal layer 20 by spot welding, for example. Thereafter, as shown in FIG. 17(*f*), the mask member 30 is removed from the support substrate 60 by a laser lift off method, for example. The vapor deposition mask 101 is obtained as described above.

Although the step of attaching the frame 40 is performed after the step of forming the openings 13 in the resin layer 10 (the laser process step) with any of the methods described with reference to FIG. 10 to FIG. 16 or FIG. 17, the step of attaching the frame 40 may be performed before the laser process step of the resin layer 10.

FIGS. 18(a) to 18(e) are cross-sectional views each showing a step of still another example of a method for manufacturing a vapor deposition mask of the present embodiment. While the method for manufacturing the vapor deposition mask 100 is described herein as an example, the other vapor deposition masks 101, 200, 201, 300, 301, 400 and 401 are also manufactured by a similar method.

First, as shown in FIG. 18(a), the resin layer 10 is formed on the support substrate 60. The resin layer 10 is formed by the application of a soluble-type polyimide solution or a polyimide precursor solution and a heat treatment, as with the methods described above.

Next, as shown in FIG. 18(b), the metal layer 20 having a predetermined pattern is formed on the resin layer 10. The metal layer 20 may be formed by electrolytic plating or electroless plating (see FIG. 12), or may be formed by patterning a metal foil (see FIG. 17).

Then, as shown in FIG. 18(c), the frame 40 is secured on the peripheral portion 20b of the metal layer 20 by spot welding, for example.

Next, as shown in FIG. 18(d), the laser process of the resin layer 10 is performed to form the openings 13 in the resin layer 10. Thereafter, as shown in FIG. 18(e), the resin layer 10 is removed from the support substrate 60 by a laser lift off method, for example. The vapor deposition mask 100 is manufactured as described above.

<Advantageous Effects of Manufacturing Method of Present Embodiment>

With the method for manufacturing a vapor deposition mask of the present embodiment, the resin layer 10 is formed by applying a solution including a resin material or a solution including a precursor of a resin material on the surface of the support substrate 60, and performing a heat treatment. The resin layer 10 formed as described above is in close contact with the support substrate 60, and no bubble occurs at the interface between the resin layer 10 and the support substrate 60. Therefore, by forming a plurality of openings 13 in the resin layer 10 on the support substrate 60, it is possible to form openings 13 of an intended size with a higher precision as compared with conventional methods, and it is also possible to suppress the occurrence of the burrs 98 (see FIG. 25).

In the present embodiment, the resin layer 10 and the metal layer 20 are formed on the support substrate 60, and the frame 40 is attached to the metal layer 20 being supported on the support substrate 60. The stretching step of attaching the resin layer 10 and the metal layer 20 to the frame while stretching the resin layer 10 and the metal layer 20 is not performed. Since there is no need to perform the stretching step using a large-scale stretcher, it is possible to reduce the manufacturing cost. Since the stretching step is not performed, tension in a predetermined layer plane direction(s) is not applied to the resin layer 10 and the metal layer 20 from the frame 40. Therefore, the rigidity of the frame 40 can be made smaller as compared with conventional methods, thereby increasing the degree of freedom in selecting the material of the frame 40 and the degree of freedom in designing the width, the thickness, etc., of the frame.

Moreover, with conventional methods described in Patent Document No. 1, etc., a laser process for the resin film is performed after the resin film is secured to the frame by the stretching step. In contrast, according to the present embodiment, the attachment step of the frame 40 may be performed before the laser process on the resin layer 10 or after the laser process. There are advantages as follows when the attachment step of the frame 40 is performed after the laser process. The mask member 30 supported on the support substrate 60 before the frame 40 is attached thereto (including the mask member before the laser process) is lighter and easier to handle than the mask member 30 after the frame 40 is attached thereto, thereby facilitating operations such as placing it on the laser process machine and carrying it around. Since the frame 40 is not attached thereto, it is easy to irradiate the resin layer 10 with the laser beam L1 and it is easy to process the resin layer 10. Moreover, with the method of Patent Document No. 1, when the laser process of the resin layer is not successful, there is a need to remove the layered mask from the frame. However, if the laser process is performed before the frame 40 is attached, there is no need for such a removing step.

With conventional methods, the metal layer was stretched together with the resin film in the stretching step. Therefore, no one had such an idea to use a metal layer having an island-like structure such that tension cannot be applied thereto. In contrast, the method of the present embodiment, in which the stretching step is not performed, can suitably be applied to the manufacture of a vapor deposition mask having the metal layer 20 of an island-like structure. By employing an island-like structure, it is possible to realize the metal layer 20 such that the area ratio SM of the solid portion is very small, and it is possible to use a metal material having a large linear thermal expansion coefficient $\alpha M$. Therefore, it is possible to increase the degree of freedom in selecting the shape and metal material of the metal layer 20 as compared with conventional methods.

The magnitude of temperature increase of the vapor deposition mask during the vapor deposition step, i.e., the difference $\Delta T$ (° C.) (=T2−T1) between temperature T1 of the vapor deposition mask during the manufacturing process and temperature T2 of the vapor deposition mask during the vapor deposition step varies depending on the vapor deposition method, the vapor deposition device, etc. When the temperature difference $\Delta T$ is suppressed to be relatively small, $\Delta T$ is less than 3° C., i.e., about 1° C. On the other hand, $\Delta T$ may be about 3° C. to about 15° C. Note that temperature T1 during the manufacturing process of the present embodiment is the temperature of the environment in which the manufacturing device (e.g., the laser process machine used for processing the resin layer 10, the welder used in the frame attachment step, etc.) is installed, e.g., room temperature. When vapor deposition is performed while relatively moving (scanning) the position of the vapor deposition source with respect to the work, temperature T2 during the vapor deposition step refers to the temperature of the portion of the vapor deposition mask where vapor deposition is being performed. In the present embodiment, when $\Delta T$ is relatively large (e.g., over 3° C.), it is possible to suppress the positional misalignment by the following method, as necessary. First, the temperature increase ($\Delta T$) of the vapor deposition mask is measured in advance. Then, based on the measurement result of $\Delta T$, the amount of positional misalignment occurring due to thermal expansion is calculated. The amount of positional misalignment includes the misalignment between the position of the opening 13 and the vapor deposition position, and the misalignment between the shape of the opening 13 and the intended vapor deposition pattern caused by the deformation of the opening 13 itself. The openings 13 of the resin layer 10 and the island-like portions 24 (or the slits 23, the openings 25) of the metal layer 20 are shifted from each other, and the size of the opening 13 is formed to be smaller than the intended vapor deposition pattern by a predetermined amount so as to cancel out the amount of positional misalignment. Note that instead of calculating the amount of positional misalignment, the amount of positional misalignment may be measured through an actual vapor deposition process. In the present embodiment, since there is a high degree of freedom in selecting the shape of the metal layer 20 (including the shape and the area ratio of the solid portion), it is possible to more effectively apply such a positional misalignment suppressing method and to ensure a sufficient positional precision.

<Suppressing Shadowing in Vapor Deposition Step>

When the metal layer 20 has a slit structure as illustrated with the vapor deposition masks 200 and 201 (FIG. 2, FIG. 6), the width (area) of the portion located between two adjacent slits 23 is preferably set in such a range that it is possible to suppress shadowing in the vapor deposition step. This will now be described with reference to the drawings.

Figure 19:
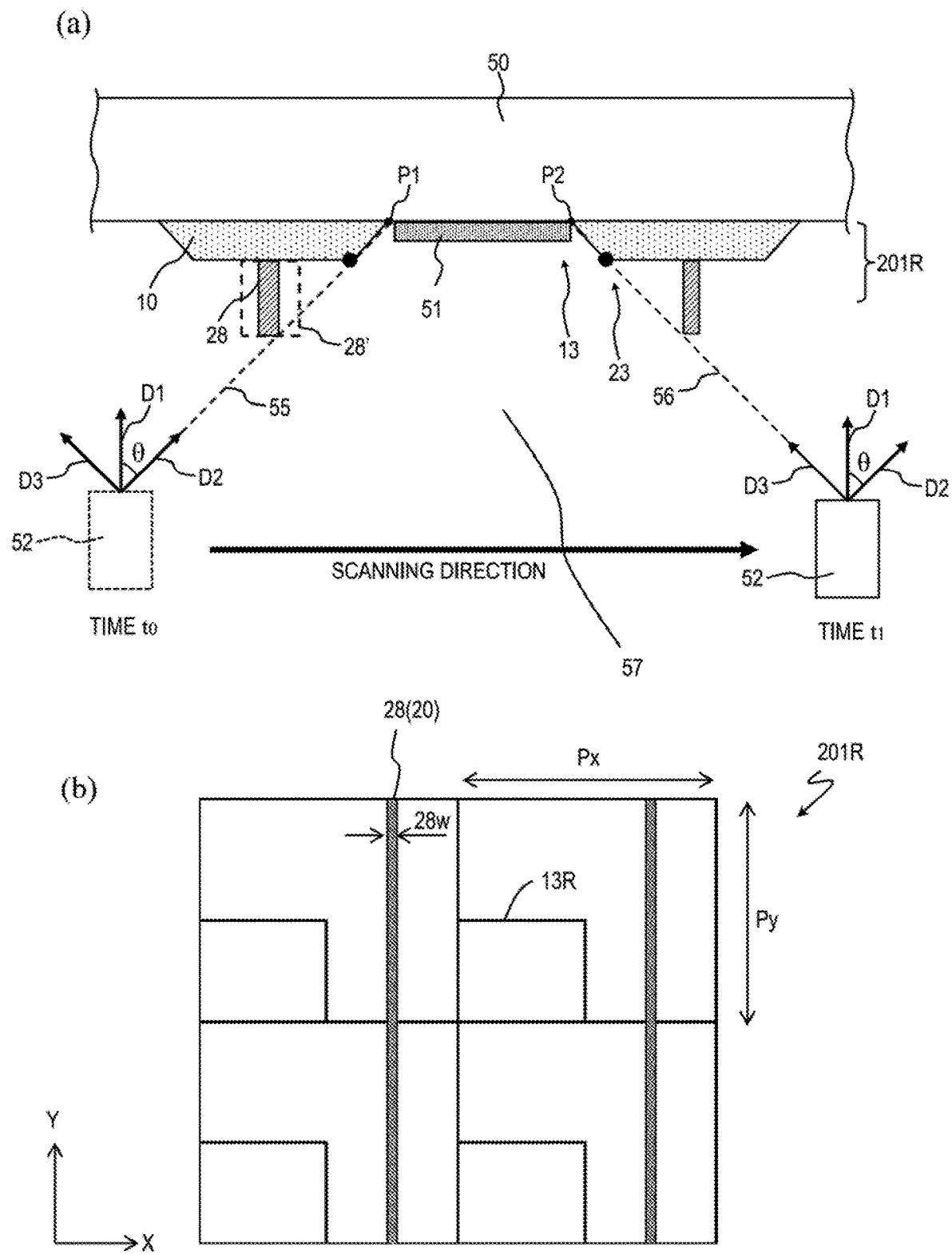
FIG. 19 (a) is an enlarged cross-sectional view illustrating a step of vapor-depositing an organic semiconductor material on a substrate to be the vapor deposition object, and (b) is an enlarged plan view showing a portion of the vapor deposition mask used in the vapor deposition step.

FIG. 19(a) is an enlarged cross-sectional view illustrating a step of vapor-depositing an organic semiconductor material on a substrate 50 to be the vapor deposition object. It illustrates a case of forming a light emitting layer for emitting red light onto a pixel electrode (not shown) of a red pixel of an organic EL display. FIG. 19(b) is a plan view showing a portion of a vapor deposition mask 201R used in the formation of the light emitting layer of the red pixel.

As shown in FIG. 19(b), the vapor deposition mask 201R has a plurality of openings 13R for forming the light emitting layer of the red pixel. The openings 13R are arranged in an array extending in the X direction and in the Y direction perpendicular to the X direction. The arrangement pitch of the openings 13R in the X direction and the Y direction correspond respectively to the pixel pitches Px and Py in the X direction and the Y direction of the organic EL display. A unit region defined by these pixel pitches is referred to as a "pixel region". A solid portion 28 of the metal layer 20 is arranged between two adjacent openings 13. In this example, the solid portion 28 extends so as to cross the pixel region in one direction (herein, the Y direction).

In the vapor deposition step, as shown in FIG. 19(a), vapor deposition is performed with the vapor deposition mask 201R placed on the substrate 50 to be the vapor deposition object to vapor-deposit an organic semiconductor material in each opening 13R. In this example, vapor deposition is performed while a vapor deposition source 52 is moved from left to right relative to the substrate 50 (that is, the scanning direction is left to right). The vapor deposition material is released from the vapor deposition source 52 not only in the direction normal to the vapor deposition mask 201R but also in diagonal directions (directions inclined with respect to the normal direction). Herein, θ denotes the spread angle of the vapor deposition material. D1 denotes the direction normal to the vapor deposition mask 201R, D2 denotes a direction that is inclined by θ with respect to the direction D1 toward the scanning direction (i.e., to the right), and D3 denotes a direction that is inclined by θ toward the opposite direction to the scanning direction (i.e., to the left). θ, for example, is 45 degrees.

FIG. 19(a) shows the position of the vapor deposition source 52 at the start (time $t_0$) of the period during which a vapor deposition film 51 is deposited in an opening 13R of the resin layer 10, and the position of the vapor deposition source 52 at the end (time $t_1$) thereof. Time $t_0$ is the time at which the vapor deposition material released from the vapor deposition source 52 starts arriving in the opening 13. At this point, a virtual straight line 55 extending in the direction D2 from the vapor deposition source 52 just passes an edge of the opening 13R on the vapor deposition source 52 side. Time $t_1$ is the time at which the vapor deposition material released from the vapor deposition source 52 stops arriving in the opening 13. At this point, a virtual straight line 56 extending in the direction D3 from the vapor deposition source 52 just passes an edge of the openings 13 on the vapor deposition source 52 side.

The vapor deposition film 51 is formed to an intended thickness across the region between point P1 that the vapor deposition material reaches at time $t_0$ (the intersection between the virtual straight line 55 and the surface of the substrate 50) and point P2 that the vapor deposition material reaches at time $t_1$ (the intersection between the virtual straight line 56 and the surface of the substrate 50). However, when a portion of the solid portion is present in a region 57 defined by the virtual straight lines 55 and 56 and the substrate 50 (the region in which the vapor deposition source material evaporated from the vapor deposition source 52 scatters), as indicated by a broken line 28', a portion of the vapor deposition source material is blocked by the solid portion 28' from reaching the substrate 50. As a result, the vapor deposition film 51 formed in the opening 13R has thinner portions. Such a portion (a portion formed to be thinner than the intended thickness) is referred to as a shadow. In contrast, when the solid portion is arranged outside the region 57, as indicated by a solid line 28, it is possible to suppress the occurrence of a shadow, and to form a light emitting layer having an intended thickness across the entire region in the opening 13R. Thus, in order to suppress the occurrence of a shadow, it is preferred to adjust the position and the width (the width in the X direction) 28w of the solid portion 28. The upper limit value of the width 28w varies depending on the pixel pitch, the size of the opening 13R, etc. The present inventors conducted a study by a simulation under the following conditions: the panel size of the organic EL display: 4.1 inches diagonally, the resolution: 400 ppi (pixels per inch), and the spread angle θ of the vapor deposition material: 45 degrees, finding that it was possible to suppress the occurrence of a shadow by setting the width 28w of the solid portion 28 so that the ratio of the area of the solid portion 28 with respect to the entire pixel region was 10.0% or less. A similar simulation was conducted under the following conditions: the panel size: 4.3 inches diagonally, the resolution: 257 ppi, and the spread angle θ of the vapor deposition material: 45 degrees, finding that it was possible to suppress the occurrence of a shadow by setting the width 28w of the solid portion 28 so that the ratio of the area of the solid portion 28 was 30.0% or less. On the other hand, when the ratio is too small, the adhesion between the vapor deposition mask 201R and the substrate 50 may lower. Thus, it is preferred that the ratio is 1.0% or more.

Note that although the vapor deposition mask 201R has been described herein, the description similarly applies to any other vapor deposition mask that has openings for forming light emitting layer for emitting blue light or red light (with a different size from the openings 13R and with the same arrangement pitch as the openings 13R).

Second Embodiment

A vapor deposition mask according to the second embodiment of the present invention will now be described.

The vapor deposition mask of the present embodiment has a cross-sectional structure and a structure as seen from above (not shown) similar to those of the vapor deposition mask of the first embodiment described above with reference to FIG. 1 to FIG. 9. Note however that the present embodiment is different from the first embodiment in that the resin layer 10 receives tension in a layer plane direction(s) from the frame 40.

FIGS. 20(a) to 20(e) are cross-sectional views each showing a step of a method for manufacturing a vapor deposition mask of the present embodiment. In FIG. 20, like components to those of FIG. 10 to FIG. 17 are denoted by like reference signs. In the following description, only differences from the first embodiment will basically be described, and the method of formation, material, thickness, etc., of the layers will not be described below if they are similar to those of the method described above.

First, as shown in FIG. 20(a), the resin layer 10 is formed on the support substrate 60. The resin layer 10 is formed by the application of a soluble-type polyimide solution or a polyimide precursor solution and a heat treatment, as with the methods described above.

Next, as shown in FIG. 20(b), the metal layer 20 having a predetermined pattern is formed on the resin layer 10. The metal layer 20 may be formed by electrolytic plating or electroless plating (see FIG. 12), or may be formed by patterning a metal foil (see FIG. 17). In the illustrated example, the metal layer 20 is formed including the mask portion 20a having a plurality of slits 23 therein, and the peripheral portion 20b located around the mask portion 20a. Note that there is no particular limitation on the shape of the metal layer 20, and the metal layer 20 may have any other shape illustrated in FIG. 1, FIG. 3 or FIG. 4.

Then, as shown in FIG. 20(c), a laser process is performed on the resin layer 10 supported on the support substrate 60, thereby forming the openings 13 in the resin layer 10. The size and positions of the openings 13 are set taking into account the deformation due to the thermal expansion of the resin film and the tension applied in the stretching step to be described later. The mask member 30 is obtained as described above. Next, as shown in FIG. 20(d), the resin layer 10 is removed from the support substrate 60 by a laser lift off method, for example.

Next, as shown in FIG. 20(e), the frame 40 is secured to the peripheral portion 20b of the metal layer 20 while the mask member 30 composed of the resin layer 10 and the metal layer 20 is stretched in a predetermined layer in-plane direction(s). Specifically, first, the frame 40 is secured on a stretch welder, with one surface 40a (the surface that is attached to the mask member 30) of the frame 40 facing up. Next, the mask member 30 is placed, with the metal layer 20 facing down, on the surface 40a of the frame 40. Then, two opposing edge portions of the mask member 30 (herein, the edge portions oppose each other in a first direction 41) are held by a holding section (clamp) of the stretch welder, and a constant tension is applied in parallel to the first direction 41. At the same time, two edge portions that oppose each other in the second direction, which is perpendicular to the first direction 41, are also held by a clamp, and a constant tension is applied in parallel to the second direction. As an example, where the width of the mask member 30 in the first direction: 400 mm, the width in the second direction: 700 mm, and the thickness (the total thickness of the resin layer 10 and the metal layer 20): 20 μm, tension of 100 N is applied in each of the first direction and the second direction.

Then, when the metal layer 20 has an island-like structure, tension is applied on the resin layer 10, but no tension is applied on the mask portion 20a of the metal layer 20. This is because the solid portion of the mask portion 20a is separated from the peripheral portion 20b. On the other hand, when the solid portion of the metal layer 20 is formed across the entire width of the mask portion 20a and is formed integrally with the peripheral portion 20b (the metal layer 20 has a slit structure, for example), as in the example shown in FIG. 20, tension is applied both on the resin layer 10 and on the metal layer 20. The level of the tension is set so that the amount of elastic deformation of the mask member 30 due to the tension (when the metal layer 20 has an island-like structure, the amount of elastic deformation of the resin layer 10) is greater than or equal to the amount of thermal expansion of the mask member 30 (or the resin layer 10) at the vapor deposition temperature. Note that the size of the mask member 30 formed on the support substrate 60 is designed in advance so that the peripheral portion 20b of the metal layer 20 and the frame 40 overlap each other with tension applied thereon. Then, the structure is irradiated with the laser beam L2 from the resin layer 10 side of the mask member 30, thereby attaching together the metal layer 20 and the frame 40. Herein, spot welding is performed at a plurality of positions spaced apart from each other. A vapor deposition mask is obtained as described above.

With the vapor deposition mask manufactured by the method described above, the resin layer 10 (or the resin layer 10 and the metal layer 20) receives tension in a layer plane direction(s) from the frame 40 while not used in the vapor deposition step. Therefore, even if a thermal expansion occurs in the resin layer 10 (and the metal layer 20) in the vapor deposition step, it is possible to suppress the occurrence of positional misalignment of the openings 13 due to the thermal expansion.

In the present embodiment, a material having a relatively small linear thermal expansion coefficient αM is suitably used as the material of the metal layer 20. The frame 40 is preferably formed from a metal. Note however that when the metal layer 20 has an island-like structure, it is only required with the finished vapor deposition mask that the frame 40 be not deformed by the tension from the resin layer 10. Therefore, the rigidity of the frame 40 may be low. Therefore, as with the embodiment described above, it is possible to use the frame 40 formed from a resin, as well as a metal.

Figure 25:
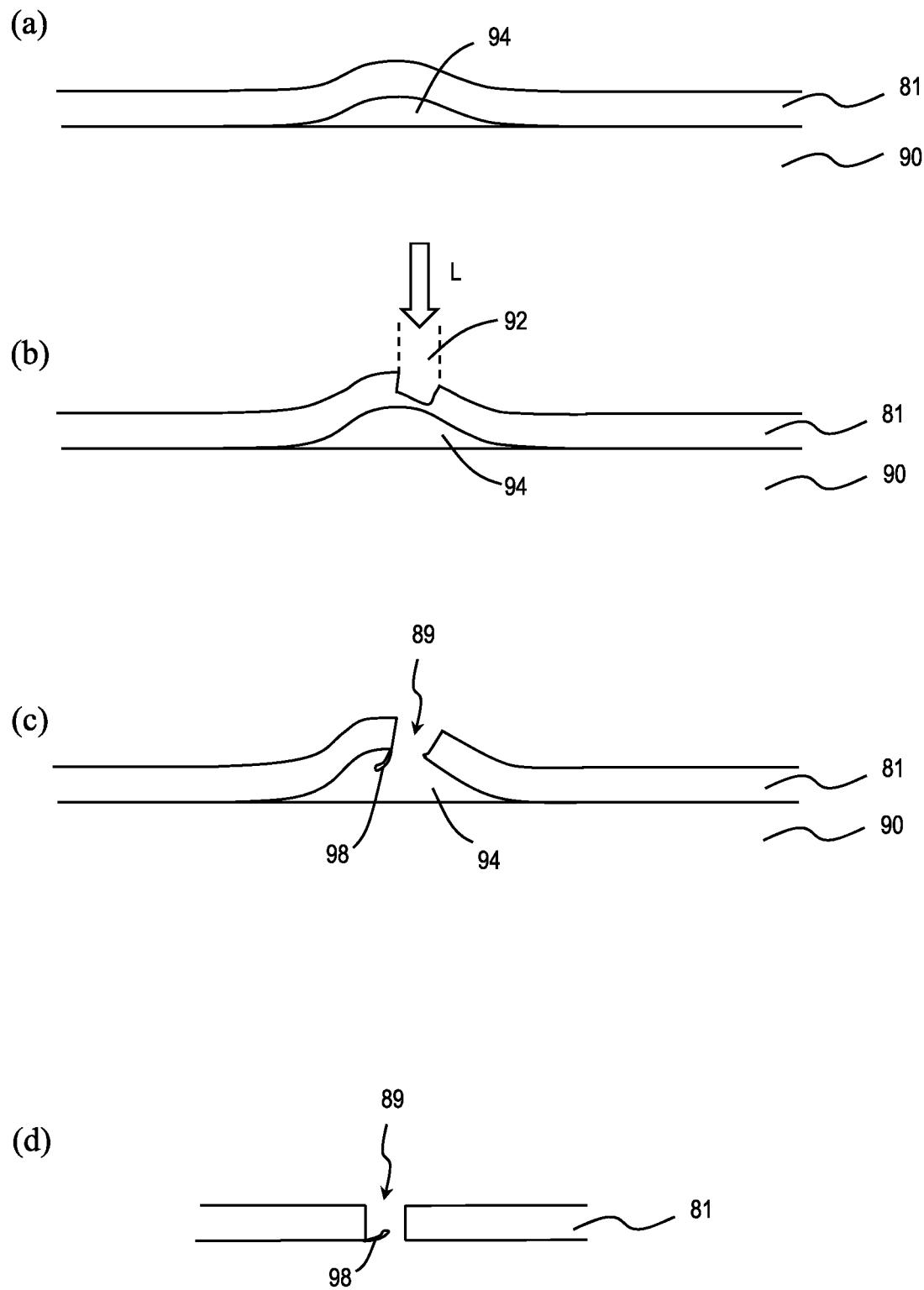
FIG. 25 (a) to (d) are schematic cross-sectional views illustrating how a burr is produced on a resin film with a laser ablation method.
Figure 26:
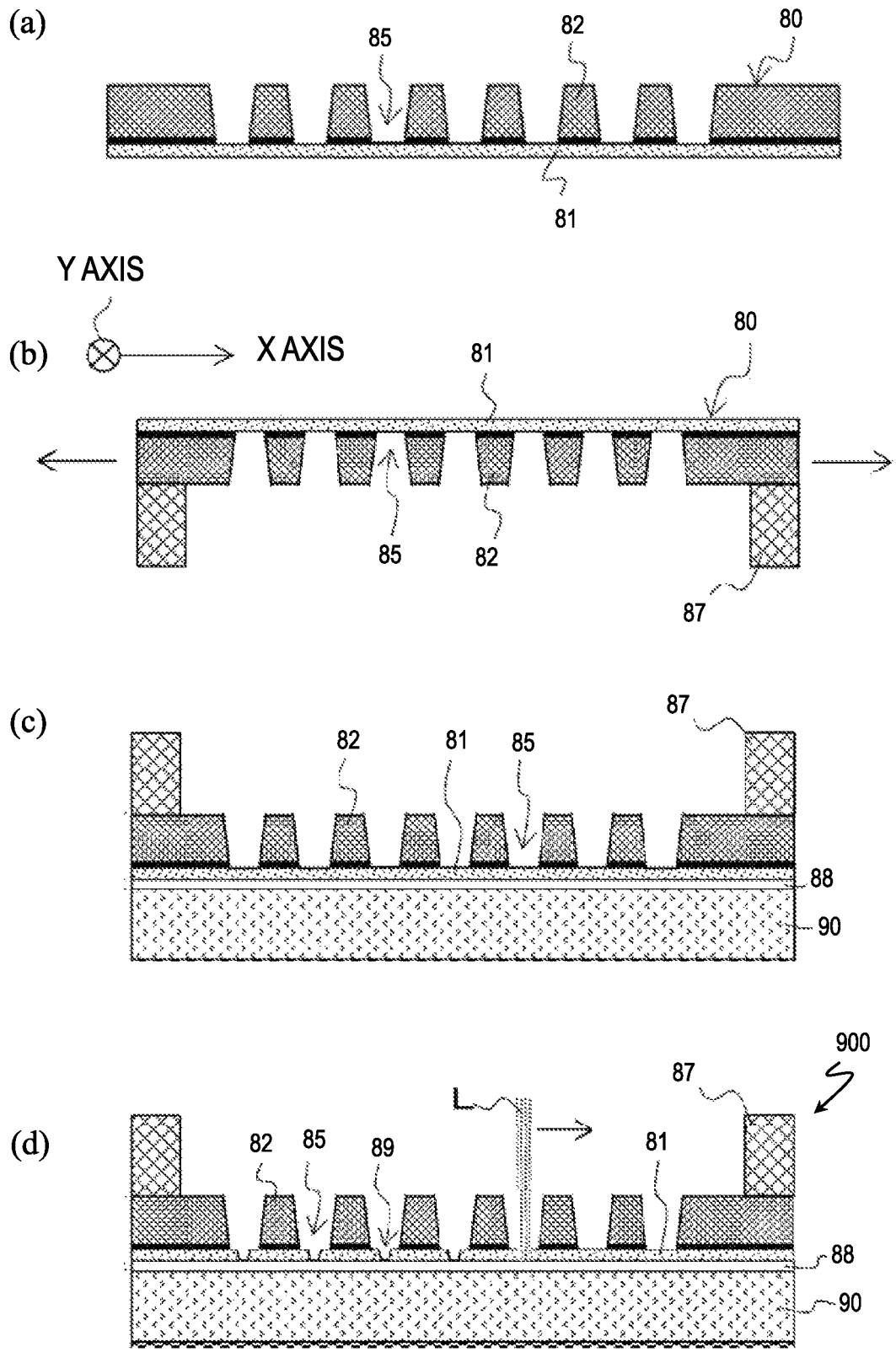
FIG. 26 (a) to (d) are schematic cross-sectional views each illustrating a step in a conventional method for manufacturing a vapor deposition mask disclosed in Patent Document No. 1.

With the method for manufacturing a vapor deposition mask of the present embodiment, as with the first embodiment, a laser process is performed on the resin layer 10 in close contact with the support substrate 60, and it is therefore possible to form openings 13 of an intended size with a higher precision as compared with conventional methods, and to suppress the occurrence of the burrs 98 (see FIG. 25).

With the present embodiment, a predetermined tension can be applied on the resin layer 10 while taking into account the temperature increase in the vapor deposition step, the thermal expansion coefficient of the resin layer 10 and the metal layer 20, etc. Therefore, it is possible to suppress positional misalignment of the openings 13 due to the thermal expansion of the vapor deposition mask in the vapor deposition step.

The manufacturing method of the present embodiment can be applied to the manufacture of various vapor deposition masks illustrated in FIG. 1 to FIG. 9. While FIG. 20 shows a method for manufacturing a vapor deposition mask including the metal layer 20 having a slit structure, it is possible to manufacture, by a similar method, a vapor deposition mask including the metal layer 20 having an island-like structure and openings.

Figure 20:
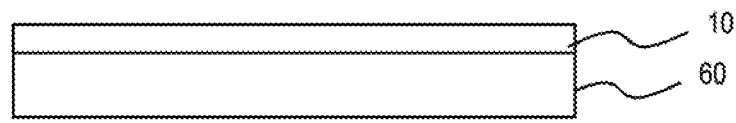
FIG. 20 (a) to (e) are cross-sectional views each showing a step of a method for manufacturing a vapor deposition mask according to a second embodiment of the present invention.
Figure 20:
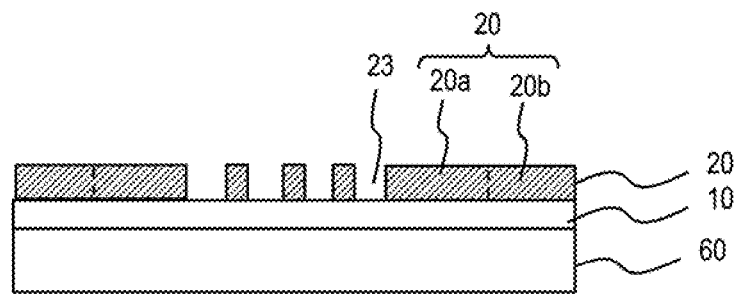
Figure 20:
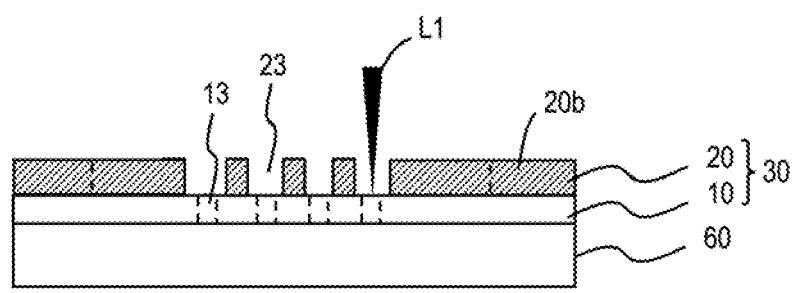
Figure 20:
Figure 20:
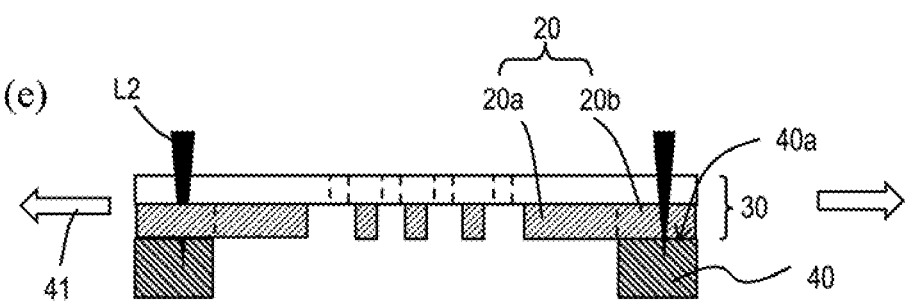

Note that while the metal layer 20 is formed on the support substrate 60 with the method shown in FIG. 20, the metal layer 20 may be formed after the resin layer 10 is removed from the support substrate 60.

Figure 21:
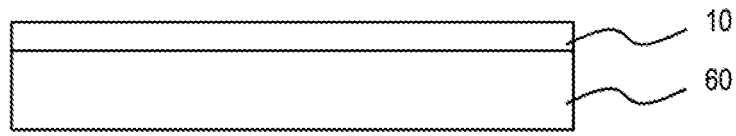
FIG. 21 (a) to (c) are cross-sectional views each showing a step of another method for manufacturing a vapor deposition mask according to the second embodiment of the present invention.
Figure 21:
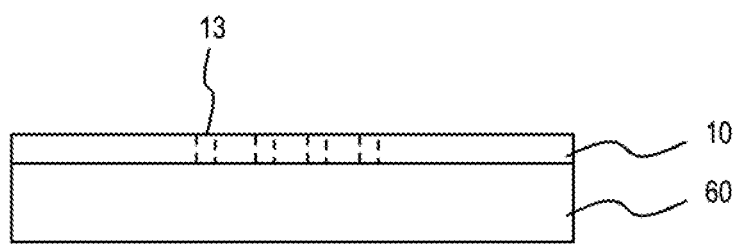
Figure 21:
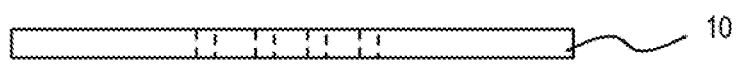

FIGS. 21(a) to 21(c) are cross-sectional views each showing a step of another manufacturing method of the present embodiment. First, as shown in FIG. 21(a), the resin layer 10 is formed on the support substrate 60. Next, as shown in FIG. 21(b), a laser process of the resin layer 10 is performed to form the openings 13. Then, as shown in FIG. 21(c), the resin layer 10 is removed from the support substrate 60, thereby obtaining a resin film 10'. Then, although not shown in the figures, a metal layer is formed on the resin film 10' and attached to the frame, thereby manufacturing a vapor deposition mask.

(Method for Manufacturing Organic Semiconductor Device)

A vapor deposition mask according to an embodiment of the present invention can suitably be used in the vapor deposition step in a method for manufacturing an organic semiconductor device.

The following description is directed to, as an example, a method for manufacturing an organic EL display device.

Figure 22:
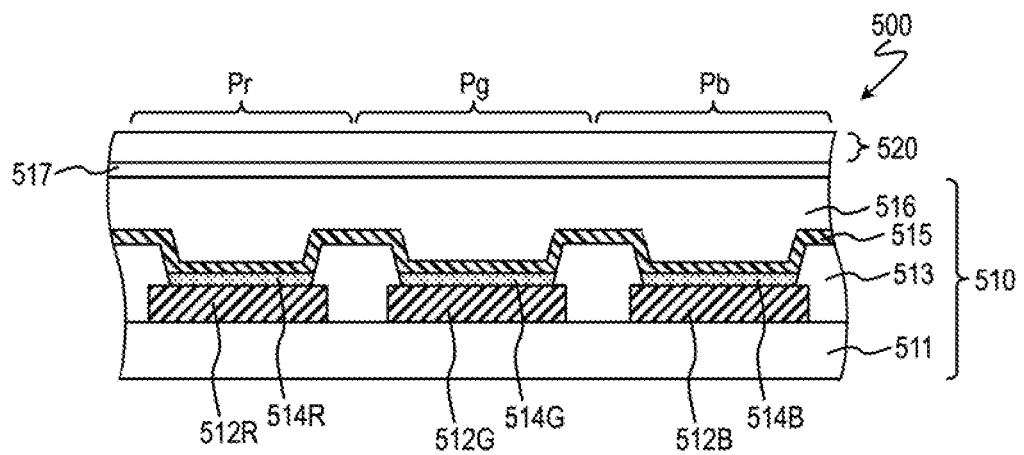
FIG. 22 A cross-sectional view schematically showing an organic EL display device 500 of a top emission type.

FIG. 22 is a cross-sectional view schematically showing an organic EL display device 500 of a top emission type.

As can be seen from FIG. 22, the organic EL display device 500 includes an active matrix substrate (TFT substrate) 510 and an encapsulation substrate 520, and includes a red pixel Pr, a green pixel Pg and a blue pixel Pb.

The TFT substrate 510 includes an insulative substrate, and a TFT circuit formed on the insulative substrate (neither is shown in the figure). A flattening film 511 is provided so as to cover the TFT circuit. The flattening film 511 is formed from an organic insulative material.

Lower electrodes 512R, 512G and 512B are provided on the flattening film 511. The lower electrodes 512R, 512G and 512B are formed in the red pixel Pr, the green pixel Pg and the blue pixel Pb, respectively. The lower electrodes 512R, 512G and 512B are each connected to the TFT circuit, and function as an anode. A bank 513 covering the edge portion of the lower electrodes 512R, 512G and 512B is provided between adjacent pixels. The bank 513 is formed from an insulative material.

Organic EL layers 514R, 514G and 514B are provided on the lower electrodes 512R, 512G and 512B of the red pixel Pr, the green pixel Pg and the blue pixel Pb, respectively. The organic EL layers 514R, 514G and 514B each have a layered structure including a plurality of layers formed from an organic semiconductor material. For example, the layered structure includes a hole injection layer, a hole transport layer, a light emitting layer, an electron transport layer and an electron injection layer that are arranged in this order from the side of the lower electrodes 512R, 512G and 512B. The organic EL layer 514R of the red pixel Pr includes a light emitting layer that emits red light. The organic EL layer 514G of the green pixel Pg includes a light emitting layer that emits green light. The organic EL layer 514B of the blue pixel Pb includes a light emitting layer that emits blue light.

An upper electrode 515 is provided on the organic EL layers 514R, 514G and 514B. The upper electrode 515 is formed, by using a transparent conductive material, so as to be continuous over the entire display area (i.e., as a shared member among the red pixel Pr, the green pixel Pg and the blue pixel Pb), and functions as a cathode. A protection layer 516 is provided on the upper electrode 515. The protection layer 516 is formed from an organic insulative material.

The structure of a TFT substrate 510 described above is encapsulated by the encapsulation substrate 520, which is bonded to the TFT substrate 510 via a transparent resin layer 517.

The organic EL display device 500 can be produced as follows by using a vapor deposition mask according to an embodiment of the present invention. FIGS. 23(a) to 23(d) and FIGS. 24(a) to 24(d) are cross-sectional views each showing a step in the process of manufacturing the organic EL display device 500. Note that the following description will focus on the step of vapor-depositing an organic semiconductor material on the work (forming the organic EL layers 514R, 514G and 514B on the TFT substrate 510) by using a vapor deposition mask 101R for red pixels, a vapor deposition mask 101G for green pixels and a vapor deposition mask 101B for blue pixels in turns.

Figure 23:
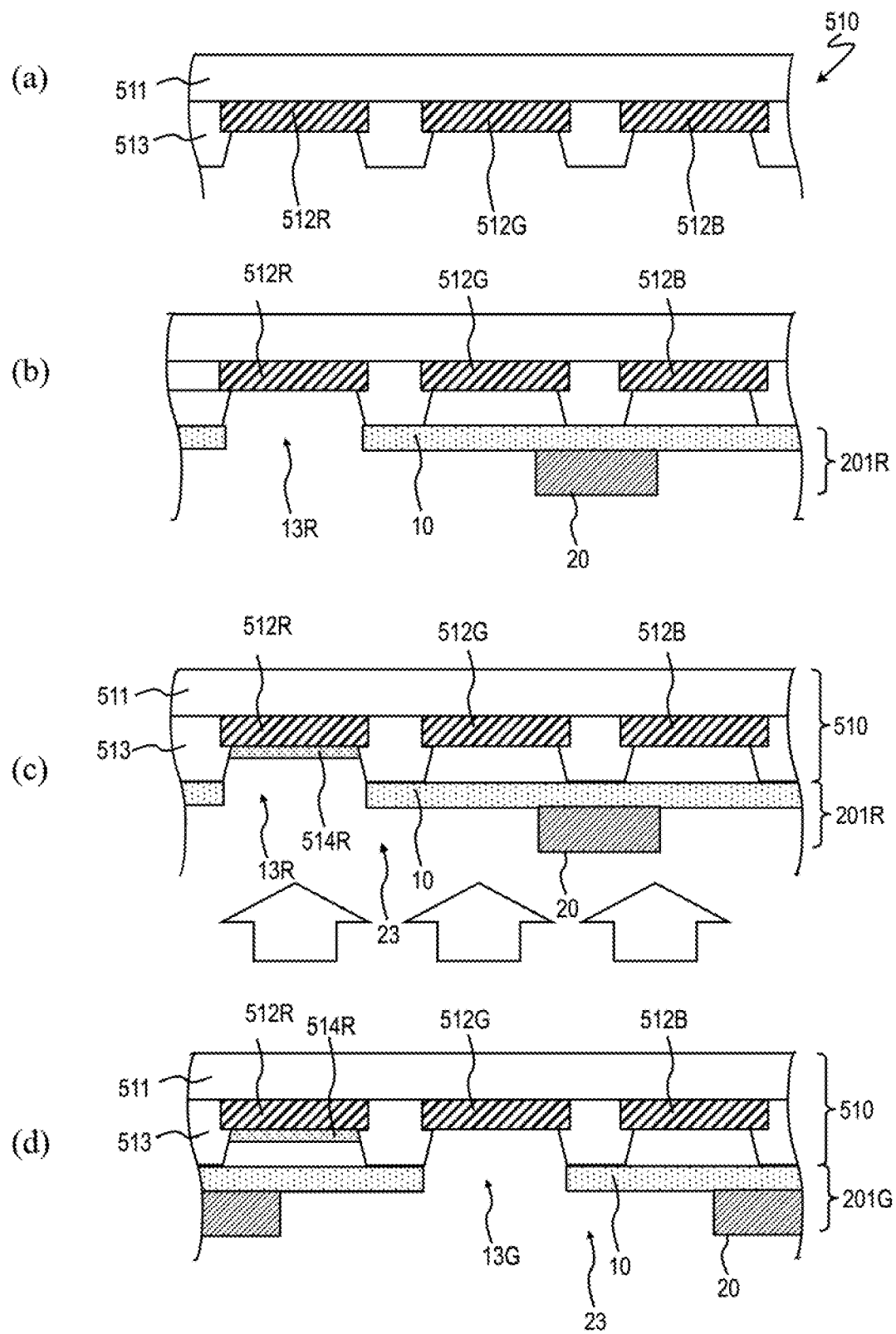
FIG. 23 (a) to (d) are cross-sectional views each showing a step in the process of manufacturing the organic EL display device 500.

First, as shown in FIG. 23(a), the TFT substrate 510 is provided, wherein the TFT substrate 510 includes the TFT circuit, the flattening film 511, the lower electrodes 512R, 512G and 512B and the bank 513 formed on an insulative substrate. The steps of forming the TFT circuit, the flattening film 511, the lower electrodes 512R, 512G and 512B and the bank 513 can be carried out by any of various methods known in the art.

Next, as shown in FIG. 23(b), a carrier device is used to arrange the TFT substrate 510 close to the vapor deposition mask 101R, which is held in the vacuum vapor deposition device. In this process, a vapor deposition mask 101R and the TFT substrate 510 are positioned so that the opening 13R of the resin layer 10 overlaps the lower electrode 512R of the red pixel Pr. A magnetic chuck (not shown) arranged on the opposite side from the vapor deposition mask 101R with respect to the TFT substrate 510 is used to hold the vapor deposition mask 101R in close contact with the TFT substrate 510.

Then, as shown in FIG. 23(c), organic semiconductor materials are successively deposited on the lower electrode 512R of the red pixel Pr by vacuum vapor deposition, thereby forming the organic EL layer 514R including a light emitting layer that emits red light.

Next, as shown in FIG. 23(d), a vapor deposition mask 101G is placed in the vacuum vapor deposition device, replacing the vapor deposition mask 101R. The vapor deposition mask 101G and the TFT substrate 510 are positioned together so that the opening 13G of the resin layer 10 overlaps the lower electrode 512G of the green pixel Pg. A magnetic chuck is used to hold the vapor deposition mask 101G in close contact with the TFT substrate 510.

Figure 24:
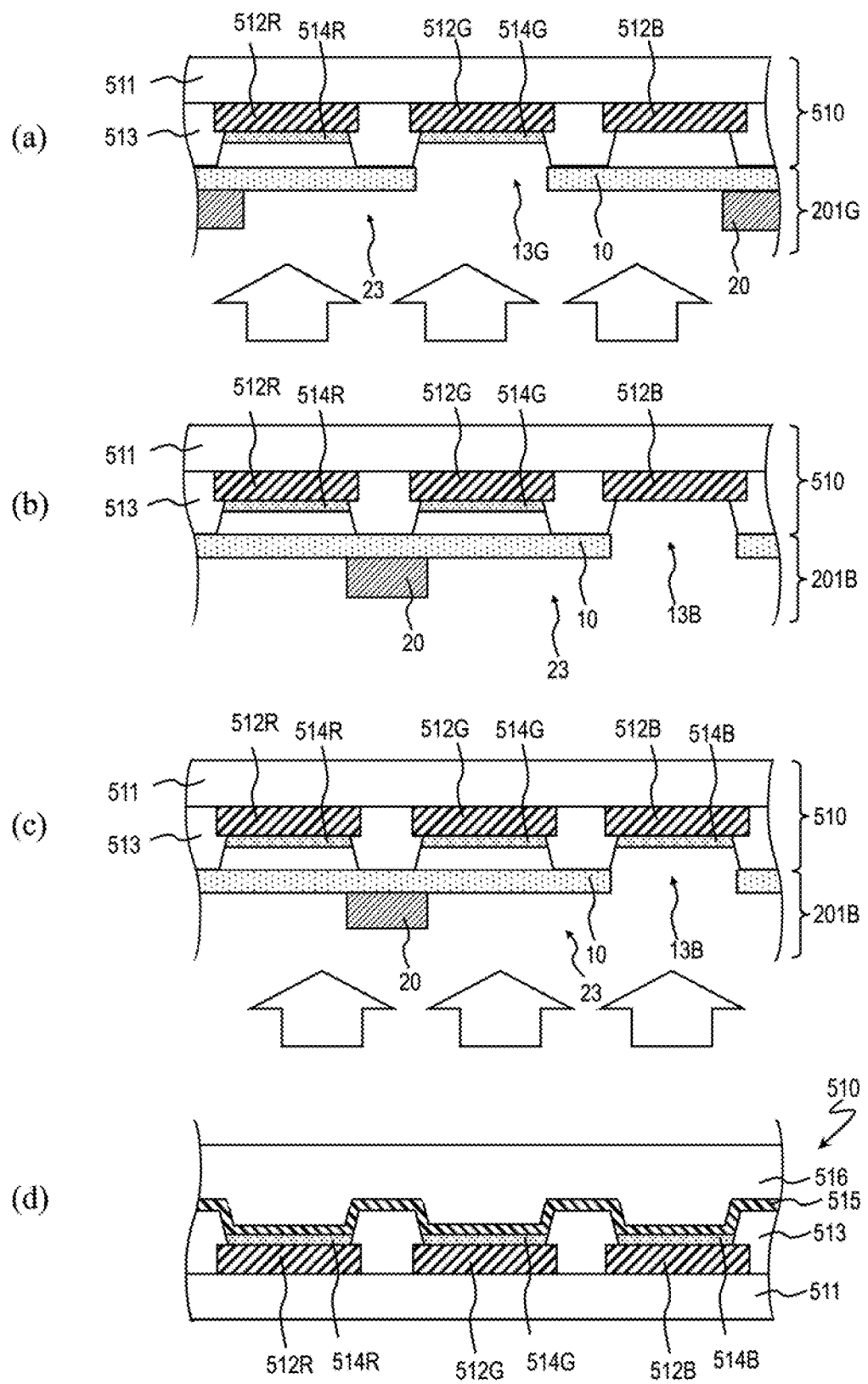
FIG. 24 (a) to (d) are cross-sectional views each showing a step in the process of manufacturing the organic EL display device 500.

Then, as shown in FIG. 24(a), organic semiconductor materials are successively deposited on the lower electrode 512G of the green pixel Pg by vacuum vapor deposition, thereby forming the organic EL layer 514G including a light emitting layer that emits green light.

Next, as shown in FIG. 24(b), a vapor deposition mask 101B is placed in the vacuum vapor deposition device, replacing the vapor deposition mask 101G. The vapor deposition mask 101B and the TFT substrate 510 are positioned together so that the opening 13B of the resin layer 10 overlaps the lower electrode 512B of the blue pixel Pb. A magnetic chuck is used to hold the vapor deposition mask 101B in close contact with the TFT substrate 510.

Then, as shown in FIG. 24(c), organic semiconductor materials are successively deposited on the lower electrode 512B of the blue pixel Pb by vacuum vapor deposition, thereby forming the organic EL layer 514B including a light emitting layer that emits blue light.

Next, as shown in FIG. 24(d), the upper electrode 515 and the protection layer 516 are formed successively on the organic EL layers 514R, 514G and 514B. The formation of the upper electrode 515 and the protection layer 516 can be carried out by any of various methods known in the art. Thus, the TFT substrate 510 is obtained.

Then, an encapsulation substrate 520 is bonded to the TFT substrate 510 via the transparent resin layer 517, thereby completing the organic EL display device 500 shown in FIG. 22.

Note that although three vapor deposition masks 101R, 101G and 101B corresponding respectively to the organic EL layers 514R, 514G and 514B of the red pixel Pr, the green pixel Pg and the blue pixel Pb are used herein, the organic EL layers 514R, 514G and 514B corresponding respectively to the red pixel Pr, the green pixel Pg and the blue pixel Pb may be formed by successively shifting a single vapor deposition mask. With the organic EL display device 500, an encapsulation film may be used instead of the encapsulation substrate 520. Alternatively, instead of using an encapsulation substrate (or an encapsulation film), a thin film encapsulation (TFE) structure may be provided over the TFT substrate 510. A thin film encapsulation structure includes a plurality of inorganic insulating films such as silicon nitride films, for example. The thin film encapsulation structure may further include an organic insulative film.

Note that although the organic EL display device 500 of a top emission type is illustrated in the above description, it is needless to say that the vapor deposition mask of the present embodiment may be used for manufacturing an organic EL display device of a bottom emission type.

An organic EL display device to be manufactured by using the vapor deposition mask of the present embodiment does not necessarily need to be a rigid device. The vapor deposition mask of the present embodiment can suitably be used in the manufacture of a flexible organic EL display device. In a method for manufacturing a flexible organic EL display device, a TFT circuit, etc., are formed on a polymer layer (e.g., a polyimide layer) formed on a support substrate (e.g., a glass substrate), and the polymer layer, together with the layered structure thereon, is removed from the support substrate (e.g., a laser lift off method is used) after the formation of a protection layer.

The vapor deposition mask of the present embodiment may be also used in the manufacture of an organic semiconductor device other than an organic EL display device, and can particularly suitably be used in the manufacture of an organic semiconductor device for which it is necessary to form a vapor deposition pattern having a high definition.

INDUSTRIAL APPLICABILITY

The vapor deposition mask according to an embodiment of the present invention can suitably be used in the manufacture of an organic semiconductor device such as an organic EL display device, and can particularly suitably be used in the manufacture of an organic semiconductor device for which it is necessary to form a vapor deposition pattern having a high definition.

REFERENCE SIGNS LIST

10 Resin layer
13 Opening
20 Metal layer
20a Mask portion
20a$_{(1)}$ Solid portion
20a$_{(2)}$ hollow portion
20b Peripheral portion
21 Conductive metal film
22 Main metal film
23 Slit
24 Island-like portions
25 Opening
27 Through hole
30 Mask member
40 Frame
60 Support substrate
70 Resist layer
71 Opening
L, L1, L2 Laser beam
100, 101, 200, 201, 300, 301, 400, 401 Vapor deposition mask
500 Organic EL display device
510 TFT substrate
511 Flattening film
512B, 512G, 512R Lower electrode
513 Bank
514B, 514G, 514R Organic EL layer
515 Upper electrode
516 Protection layer
517 Transparent resin layer
520 Encapsulation substrate
Pb Blue pixel
Pg Green pixel
Pr Red pixel
U Unit region

The invention claimed is:

1. A method for manufacturing a vapor deposition mask comprising a resin layer, and a magnetic metal layer formed on the resin layer, the method comprising:
   providing a substrate;
   forming a resin layer by applying a solution comprising a resin material or a precursor solution of a resin material on a surface of the substrate, and then performing a heat treatment thereon;
   forming a magnetic metal layer on the resin layer, wherein the magnetic metal layer comprises a mask portion and a peripheral portion arranged so as to surround the mask portion, the mask portion comprising a solid portion where a metal film is present and a hollow portion where the metal film is absent;
   forming a plurality of openings in a region of the resin layer that is located in the hollow portion of the mask portion; and
   removing the resin layer from the substrate after forming a plurality of openings;
   wherein the hollow portion of the magnetic metal layer comprises a plurality of slits, and the solid portion of the magnetic metal layer comprises a plurality of island-like portions arranged discretely in each of the plurality of slits.

2. The method for manufacturing a vapor deposition mask according to claim 1, further comprising securing a frame on the peripheral portion of the magnetic metal layer after forming a magnetic metal layer on the resin layer before removing the resin layer from the substrate.

3. The method for manufacturing a vapor deposition mask according to claim 2, wherein securing the frame on the peripheral portion of the magnetic metal layer is performed after-forming a plurality of openings.

4. The method for manufacturing a vapor deposition mask according to claim 2, wherein when securing the frame on the peripheral portion of the magnetic metal layer, the frame is secured on the magnetic metal layer with no external tension applied on the magnetic metal layer and the resin layer in any in-plane directions of the layers.

5. The method for manufacturing a vapor deposition mask according to claim 1, further comprising securing a frame on the peripheral portion of the magnetic metal layer after removing the resin layer from the substrate.

6. The method for manufacturing a vapor deposition mask according to claim 1, wherein when forming a magnetic metal layer on the resin layer, the solid portion of the mask portion includes a plurality of discretely-arranged island-like portions.

7. A vapor deposition mask manufactured by using a method for manufacturing a vapor deposition mask comprising a resin layer, and a magnetic metal layer formed on the resin layer, the method comprising:
providing a substrate;
forming a resin layer by applying a solution comprising a resin material or a precursor solution of a resin material on a surface of the substrate, and then performing a heat treatment thereon;
forming a magnetic metal layer on the resin layer, wherein the magnetic metal layer comprises a mask portion and a peripheral portion arranged so as to surround the mask portion, the mask portion comprising a solid portion where a metal film is present and a hollow portion where the metal film is absent;
forming a plurality of openings in a region of the resin layer that is located in the hollow portion of the mask portion; and
removing the resin layer from the substrate after forming a plurality of openings;
wherein the hollow portion of the magnetic metal layer comprises a plurality of slits, and the solid portion of the magnetic metal layer comprises a plurality of island-like portions arranged discretely in each of the plurality of slits.

8. A vapor deposition mask comprising a resin layer, and a magnetic metal layer formed on the resin layer, wherein:
the magnetic metal layer comprises a mask portion and a peripheral portion arranged so as to surround the mask portion, the mask portion comprising a solid portion where a metal film is present and a hollow portion where the metal film is absent;
the vapor deposition mask further comprises a frame secured on the peripheral portion of the magnetic metal layer; and
the resin layer has a plurality of openings arranged in the hollow portion of the mask portion, and is not receiving tension in any in-plane directions of the resin layer from the frame;
wherein the hollow portion of the magnetic metal layer comprises a plurality of slits, and the solid portion of the magnetic metal layer comprises a plurality of island-like portions arranged discretely in each of the plurality of slits.

9. The vapor deposition mask according to claim 8, wherein the frame is formed from a metal or a plastic.

10. The vapor deposition mask according to claim 8, wherein the resin layer is a layer formed by performing a heat treatment on a solution comprising a resin material or a precursor solution of a resin material applied on a substrate surface.

11. The vapor deposition mask according to claim 8, wherein the magnetic metal layer is a plating layer or a metal foil.

12. A vapor deposition mask comprising a resin layer, and a magnetic metal layer formed on the resin layer, wherein:
the magnetic metal layer comprises a mask portion and a peripheral portion arranged so as to surround the mask portion, the mask portion comprising a solid portion where a metal film is present and a hollow portion where the metal film is absent; and
the resin layer is a layer formed by performing a heat treatment on a solution comprising a resin material applied on a substrate surface, and has a plurality of openings arranged in the hollow portion of the mask portion;
wherein the hollow portion of the magnetic metal layer comprises a plurality of slits, and the solid portion of the magnetic metal layer comprises a plurality of island-like portions arranged discretely in each of the plurality of slits.

13. A vapor deposition mask comprising a resin layer, and a magnetic metal layer formed on the resin layer, wherein:
the magnetic metal layer comprises a plurality of slits and a plurality of island-like portions arranged discretely in each of the plurality of slits, and a peripheral portion arranged so as to surround the plurality of island-like portions; and
the resin layer has a plurality of openings arranged between the plurality of island-like portions.

14. The vapor deposition mask according to claim 13, wherein $\alpha M$ is greater than $\alpha R$, and $\alpha M \cdot SM/\alpha R$ is 0.90 or more and 1.10 or less, where SM (%) denotes an area ratio of the plurality of island-like portions inside the peripheral portion as the magnetic metal layer is seen from a normal direction, $\alpha M$ (ppm/° C.) denotes a linear thermal expansion coefficient of a metal material forming the magnetic metal layer, and $\alpha R$ (ppm/° C.) denotes a linear thermal expansion coefficient of a resin film forming the resin layer.

15. The vapor deposition mask according to claim 14, wherein SM is 50% or less.

16. A method for manufacturing an organic semiconductor device comprising the step of vapor-depositing an organic semiconductor material on a work by using the vapor deposition mask according to claim 8.

* * * * *